United States Patent
Bottomley et al.

(10) Patent No.: US 6,570,910 B1
(45) Date of Patent: May 27, 2003

(54) BASEBAND PROCESSOR WITH LOOK-AHEAD PARAMETER ESTIMATION CAPABILITIES

(75) Inventors: Gregory E. Bottomley, Cary, NC (US); Paul W. Dent, Pittsboro, NC (US); Ross W. Lampe, Raleigh, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/426,374

(22) Filed: Oct. 25, 1999

(51) Int. Cl.[7] .............................. H04B 1/66; H03D 1/00
(52) U.S. Cl. ...................................... 375/148; 375/341
(58) Field of Search ................................ 375/148, 341, 375/130; 704/258

(56) References Cited

U.S. PATENT DOCUMENTS

| | | | |
|---|---|---|---|
| 5,557,645 A | 9/1996 | Dent ........................... | 375/340 |
| 6,134,260 A | * 10/2000 | Bottomley et al. .......... | 375/130 |
| 6,304,618 B1 | * 10/2001 | Hafeez et al. ............... | 375/341 |
| 6,363,104 B1 | * 3/2002 | Bottomley ................... | 375/148 |

FOREIGN PATENT DOCUMENTS

| | | |
|---|---|---|
| EP | 0 453 814 A2 | 3/1991 |
| EP | 0 550 143 A2 | 7/1993 |

OTHER PUBLICATIONS

H. Zamiri–Jafarian and S. Pasupathy, "Adaptive MLSDE Using the EM Algorithm", IEEE Trans. Commun., vol. 47, No. 8, pp. 1181–1193, Aug. 1999.

M. McIntyre and A. Ashley, "A Simple Fixed–Lag Algorithm for Tracking Frequency Rate–of–Change", IEEE Trans. Commun., vol. 29, No. 3, pp. 677–684, Jul. 1993.

"Joint Data and Channel Estimation Using the Per–Branch Processing Method". *Proceedings of IEEE Signal Processing Workshop on Wireless Communications*, 389–392, Apr. 1997.

Raphaeli, Dan "Efficient Decoding Algorithms for Noncoherent Trellis Coded Phase Modulation," Proceedings of the Globel Telecommunications Conferences (Globecom) US, New York, IEEE, Nov. 28, 1994, pp. 1284–1288.

Form PCT/ISA/206 (Invitation to Pay Additional Fees) and Annex (Communication Relating to the Results of the Partial International Search), PCT/US00/25927, Jan. 22, 2001.

International Search Report, PCT/US00/25927, Apr. 23, 2001.

* cited by examiner

*Primary Examiner*—Stephen Chin
*Assistant Examiner*—Edith Yeh
(74) *Attorney, Agent, or Firm*—Myers Bigel Sibley & Sajovec

(57) ABSTRACT

In a receiver for receiving data samples including a sequence of symbol values transmitted across the channel, a baseband processor including a first hypothesize unit developing first sets of hypothetical symbol values, a second hypothesize unit developing second sets of hypothetical symbol values different from the first sets, a parameter estimator receiving the received data samples and the first and second sets of hypothetical symbol values and developing parameter estimates based thereon, and a sequence estimator receiving the developed parameter estimates, the first sets of hypothetical symbol values and a delayed version of the received data samples and developing a sequence of detected symbol values related to the received data samples.

73 Claims, 6 Drawing Sheets

BASEBAND PROCESSOR WITH LOOK-AHEAD PARAMETER ESTIMATION CAPABILITIES

FIELD OF THE INVENTION

The present invention is directed toward baseband processors for use in communications systems, for example, wireless communications systems and, more particularly, toward a baseband processor having look-ahead parameter estimation capabilities for improved channel tracking performance.

BACKGROUND OF THE INVENTION

Communication via wireless networks is becoming prevalent in today's society. Additional radio spectrum is being allotted for commercial use, and cellular phones are becoming increasingly commonplace. Due to the variety of different frequency bands being used, the need for dual-band phones, operational in each of the different frequency bands, has arisen. For example, in the United States, wireless phone service is offered in both the cellular (approx. 800 MHz) and PCS (Personal Communications Services) (approx. 1900 MHz) frequency bands. Wireless phone service providers generally have a mixture of cellular and PCS licenses. Thus, to offer seamless service across the country, customers of wireless phone service require dual-band phones.

In addition, there is currently an evolution from analog to digital communications. Digital speech is represented by a series of bits, which are modulated and transmitted from a base station to a phone, and vice versa. The phone demodulates the received waveform to recover the bits as originally transmitted, and the recovered bits are then converted back into speech. Further, growing data services, such as E-mail, Internet access, etc., require digital communications.

Many types of digital communications systems are currently available. For example, FDMA (Frequency-Division-Multiple-Access) systems divide the radio spectrum into a plurality of radio channels corresponding to different carrier frequencies. TDMA (Time-Division-Multiple-Access) systems further divide the carrier frequencies into time slots. D-AMPS (Digital Advanced Mobile Phone System), PDC (Pacific Digital Cellular), and GSM (Global System for Mobile communications) are examples of digital TDMA cellular systems. Alternatively, if the radio channel is wide enough, multiple users can use the same channel using spread spectrum techniques and CDMA (Code-Division-Multiple-Access). IS-95 and J-STD-008 are examples of wireless systems incorporating CDMA standards.

Regardless of the modulation or multiple access method used, a communications system must provide good quality, such as good speech quality, which is critical for customer satisfaction. To provide the necessary high quality at the receiver end, advanced demodulation techniques are generally employed, such as coherent demodulation with channel estimation and, if necessary, Automatic Frequency Correction (AFC).

A transmitted radio signal passes through a transmission medium, often referred to as a channel. Conventional receivers use channel estimation to compensate for the effects of the channel on the received signal. Channel estimation is typically performed by a baseband processor at the receiver and involves estimating channel coefficients associated with the received signal. The channel coefficients represent modifications occurring to the received signal during transmission. In many wireless applications, the quantities to be estimated change with time, such that the channel coefficient changes need to be tracked. This is also called adaptive parameter estimation. Tracking is typically performed with decision feedback, using past symbol detections to assist in updating the channel coefficients. In certain receiver designs, such as Maximum Likelihood Sequence Estimation (MLSE) receivers, decision feedback channel estimation requires a delay to obtain reliable detected symbol values. This introduces a delay in the channel tracking processing, leading to poor performance when the channel is changing rapidly.

For better channel estimation, it is desirable to have not only information about past and current symbol detections, but also information after the symbol period of interest. One solution is to employ periodically placed pilot symbols in the signal at the transmitter end. At the receiver end, the channel is estimated over the pilot symbols and interpolated in between. However, pilot symbols introduce additional overhead, reducing information symbol energy and/or the number of information symbols that can be transmitted. An alternative is to employ a noncoherent receiver which does not require explicit estimation of the channel, such as a noncoherent MLSE receiver, or a noncoherent MAP (Maximum A-Posteriori Probability) symbol-by-symbol detector. However, these receivers are much more complex and costly than standard coherent receivers.

The present invention is directed toward overcoming one or more of the above-mentioned problems.

SUMMARY OF THE INVENTION

A method is provided of detecting received symbol values in a communications system. In one form, the method generally includes the steps of receiving data samples including a sequence of symbol values, developing sets of future hypothetical symbol values, developing sets of parameter estimates, one set for each of the sets of future hypothetical symbol values, based on the received data samples and the sets of future hypothetical symbol values, developing a plurality of metrics, one each for the sets of parameter estimates, based on the sets of parameter estimates and the received data samples, and developing detected symbol values based on the plurality of metrics, the detected symbol values related to the received data samples.

In another form, the method generally includes the steps of receiving data samples including a sequence of symbol values, hypothesizing combinations of symbol values, developing, subsequent to the hypothesizing step, parameter estimates associated with each combination of hypothesized symbol values based on the received data samples and the hypothesized symbol values, developing, subsequent to the step of developing parameter estimates, metrics associated with each parameter estimate based on the received data samples, the hypothesized symbol values and the parameter estimates, and developing, subsequent to the step of developing metrics, detected symbol values based on the metrics, the detected symbol values related to the received data samples.

In yet another form, the method generally includes the steps of receiving data samples including sequences of symbol values, developing first sets of hypothetical symbol values for a first set of symbol periods, developing second sets of hypothetical symbol values for a second set of symbol periods, wherein the second set of symbol periods includes at least one symbol period later in time than the symbol periods in the first set of symbol periods, developing parameter estimates based on the received data samples and the second sets of hypothetical symbol values, developing metrics, more than one each for the first sets of hypothetical symbol values, based on the received data samples, the parameter estimates and the first sets of hypothetical symbol values, and developing detected symbol values based on the metrics, the detected symbol values related to the received data samples.

In still another form, the method generally includes the steps of receiving data samples including sequences of symbol values, developing a plurality of parameter estimates based on the received data samples, developing, subsequent to the step of developing parameter estimates, a plurality of metrics based on the developed parameter estimates and the received data samples, and developing, subsequent to the step of developing metrics, detected symbol values based on the plurality of metrics, the detected symbol values related to the received data samples.

A baseband processor is also provided for use in a receiver receiving data samples transmitted across the channel. In one form, the baseband processor generally includes a hypothesize unit developing sets of hypothetical symbol values, a parameter estimator developing parameter estimates based on the received data samples and the sets of hypothetical symbol values, and a sequence estimator receiving the developed parameter estimates, the sets of hypothetical symbol values and a delayed version of the received data samples and developing a sequence of detected symbol values related to the received data samples.

In another form, the baseband processor generally includes a first hypothesize unit developing first sets of hypothetical symbol values, a second hypothesize unit developing second sets of hypothetical symbol values different from the first sets, a parameter estimator receiving the received data samples and the first and second sets of hypothetical symbol values and developing parameter estimates based thereon, and a sequence estimator receiving the developed parameter estimates, the first sets of hypothetical symbol values and a delayed version of the received data samples and developing a sequence of detected symbol values related to the received data samples.

It is an object of the present invention to provide a baseband processor having look-ahead parameter estimation capabilities.

It is a further object of the present invention to provide a baseband processor capable of performing channel estimation on hypotheses of future symbols, as well as hypotheses of current and past symbols.

It is yet a further object of the present invention to provide baseband processor capable of performing parameter estimation that exploits information about the channel before, during and after the symbol period of interest without adding additional overhead signaling.

It is still a further object of the present invention to provide a baseband processor capable of updating channel estimates prior to updating branch and path metrics for demodulation.

Other aspects, objects and advantages of the present invention can be obtained from a study of the application, the drawings, and the appended claims.

DETAILED DESCRIPTION OF THE INVENTION

While the present invention is described in the context of a narrowband, linearly modulated signal, such as utilized in IS-136 D-AMPS downlink communications, the present invention is not limited to such systems, as it is also applicable to systems employing other forms of modulation, including, but not limited to, direct sequence spreading in wideband applications.

Figure 1:
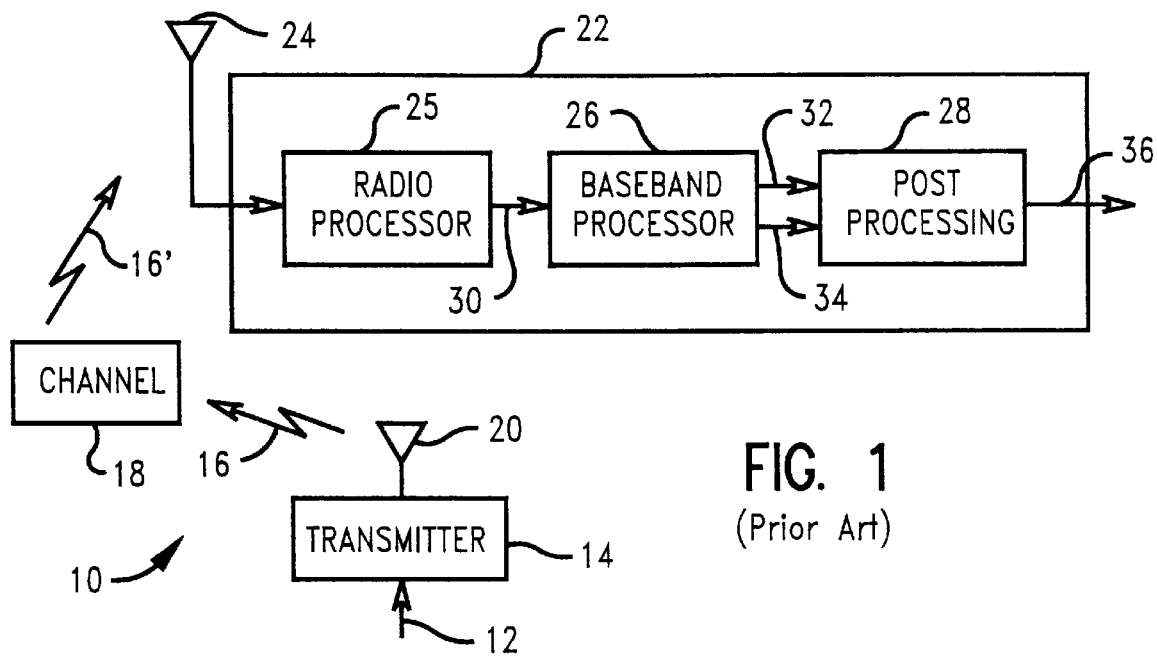
FIG. 1 is a block diagram of a typical digital communications system.

FIG. 1 illustrates a typical prior art wireless digital communications system, shown generally at 10. Digital symbols 12, such as binary ±1 values, representative of speech or other data, are provided to a transmitter 14 which maps the digital symbols 12 into a representative waveform signal 16 for transmission across a radio channel 18 via an antenna 20. The transmitted signal 16 passes through the channel 18 and is received as a modified signal 16' at a receiver 22 by one or more antennas 24. The receiver 22 generally includes a radio processor 25, a baseband signal processor 26, and a post processing unit 28 for processing the received signal 16'.

While the present invention is described in the context of a wireless communications system, the term "channel" is used herein in a general sense, and refers to any medium through which signals are transmitted. For example, the channel may be a radio environment, a copper wire, an optical fiber, or a magnetic storage medium. In each case, the received signal 16' differs from the transmitted signal 16 due to the effects of transmission through the channel 18. The received signal 16' often includes noise and interference from other signals which diminish the quality of the signal and increase the probability of transmission errors.

The received signal 16' is input to the radio processor 25, which is tuned to the desired band and desired carrier frequency. The radio processor 25 amplifies, mixes, and filters the received signal 16' down to baseband. The radio processor 25 may also sample and quantize the baseband signal, producing a sequence of baseband received samples 30. Since the originally transmitted radio signal 16 typically has both in-phase (I) and quadrature (Q) components, the baseband samples 30 are also typically complex having both I and Q components. The baseband processor 26 receives the baseband samples 30 and detects the digital symbols that were originally transmitted producing a sequence of hard detected values 32. The baseband processor 26 may also produce soft information, or soft values 34, as well, which provide information regarding the accuracy of the hard detected symbol values 32.

The post processing unit 28 receives the hard detected 32 and soft detected 34 values, if any, and performs functions that depend highly on the particular communications application. For example, the post processing unit 28 may use the soft detected values 34 to perform forward error correction decoding or error detection decoding on the hard detected values 32. If the originally transmitted signal 16 was a speech signal, the post processing unit 28 converts the hard detected symbol values 32 developed by the baseband processor 28 into a speech signal 36 using a speech decoder (not shown).

Detection of the originally transmitted digital symbols by the baseband processor 26 often requires estimation of how the transmitted signal 16 was modified by the radio channel 18, or possibly by the radio processor 25. For example, the radio channel 18 may have introduced phase and amplitude changes in the transmitted signal as a result of multipath propagation. The transmitted signal 16 may also have become dispersed, giving rise to signal echoes. Coherent demodulation by the baseband processor 26 requires estimation of these effects. Typically, the channel is modeled as a tapped delay line, with channel coefficients assigned to different delays, or echos, of the transmitted signal 16. Channel estimation is commonly used to determine the channel coefficients.

If mixing down to baseband in the radio processor 25 is imperfect, then a frequency error may have been introduced into the baseband signal 30. Some form of frequency offset compensation or Automatic Frequency Correction (AFC) is often used to correct this problem.

In wireless applications, the quantities to be estimated generally change with time and, accordingly, channel coefficient changes need to be tracked. With a two-tap channel model, the received complex symbol-spaced baseband samples r(k) are given by:

$$r(k)=c_0(k)s(k)+c_1(k)s(k-1)+n(k), \quad (1)$$

where $c_j(k)$ are the time-varying channel coefficients, s(k) and s(k−1) are the current and past symbols sent, and n(k) is the noise introduced by the channel 18 and other sources.

In the prior art of Viterbi Maximum Likelihood Sequence Estimation, transmission from the point where data symbols 's' are applied to a transmitter modulator to the point where data samples 'r' emerge from a receiver is estimated by the equation:

$$\hat{r}(k)=\hat{c}_0(k,k-d-1)\hat{s}(k)+\hat{c}_1(k,k-d-1)\hat{s}(k-1) \quad (2)$$

where the notation $\hat{c}_0(k,k-d-1)$, $\hat{c}_1(k,k-d-1)$ signifies that the channel coefficients $\hat{c}_0$ and $\hat{c}_1$ were estimated for time period k based on received signal samples up to and including time period (k−d−1), and using already hypothesized symbols only up to symbol $\hat{s}(k-d-1)$. Such channel estimates correspond to (d+1)-step predicted values.

Prior art Viterbi MLSE equalizers calculate an error between an actual received sample r(k) and the value predicted $\hat{r}(k)$ using equation (2) to obtain a branch or delta metric:

$$dM(k)=|r(k)-\hat{c}_0(k,k-d-1)\hat{s}(k)-\hat{c}_1(k,k-d-1)\hat{s}(k-1)|^2. \quad (3)$$

The delta metrics are added to cumulative path metrics (accumulated past delta metrics) for previous sequence hypotheses ending in $\hat{s}(k-1)$ to obtain new candidate metrics for sequences ending in $\hat{s}(k)$. Using the Viterbi algorithm, some of the candidate metrics are eliminated from consideration giving rise to a new set of path metrics. Then, for each possible pair of values of s(k),s(k−1), the hypothesis ending in values having the best (e.g., lowest) path metric is retained along with the associated values of $\hat{c}_0(k,k-d-1)$ and $\hat{c}_1(k,k-d-1)$. These retained, or inherited, channel estimates are updated using another received signal sample number (k−d), i.e., using r(k−d) and symbols up to s(k−d). For an LMS (Least Mean Square) channel tracker the update equations are:

$$\hat{c}_0(k-d+1,k-d)=\hat{c}_0(k-d,k-d-1)+\mu s^*(k-d)e(k-d) \quad (4)$$

and $$\hat{c}_1(k-d+1,k-d)=\hat{c}_1(k-d,k-d-1)+\mu s^*(k-d-1)e(k-d), \quad (5)$$

where 'e' is an error signal given by $$e(k-d)=r(k-d)-\hat{c}_0(k-d,k-d-1)\hat{s}(k-d)-\hat{c}_1(k-d,k-d-1)\hat{s}(k-d-1), \quad (6)$$

where $\mu$ is the LMS step size, and where * indicates a complex conjugate, thus advancing the channel estimates by one symbol period to time (k−d+1) which will be needed in equation (6) at the next iteration. The channel estimates for time k as provided in equation (2) are estimated by extrapolating the estimates for time (k−d). Similarly, the channel estimates needed for time (k+1) are extrapolated from those just calculated for a time period (k−d+1) by equations (4) and (5), for example, by using the first derivatives $\hat{c}_0'$ and $\hat{c}_1'$ as follows:

$$\hat{c}_0(k+1,k-d)=\hat{c}_0(k-d+1,k-d)+d.\hat{c}_0'(k-d+1, k-d).dt \quad (7)$$

and $$\hat{c}_1(k+1,k-d)=\hat{c}_1(k-d+1,k-d)+d.\hat{c}_1'(k-d+1,k-d).dt. \quad (8)$$

When the derivatives of the channel estimates are also tracked, equations (4) and (5) are expanded to include updating of the derivatives to obtain:

$$\begin{pmatrix} \hat{c}_0(k-d+1,k-d) \\ \hat{c}_0'(k-d+1,k-d) \end{pmatrix} = \begin{pmatrix} 1 & dt \\ 0 & 1 \end{pmatrix}\begin{pmatrix} \hat{c}_0(k-d,k-d-1) \\ \hat{c}_0'(k-d,k-d-1) \end{pmatrix} + \hat{s}*(k-d)e(k-d)\begin{pmatrix} 1 \\ dt \end{pmatrix}, \quad (9)$$

and similar with suffix 1 for updating $\hat{c}_1$ and $\hat{c}_1'$. By suitable choice of arbitrary units, the time-step dt, which is one symbol period, can be set to one.

Figure 2:
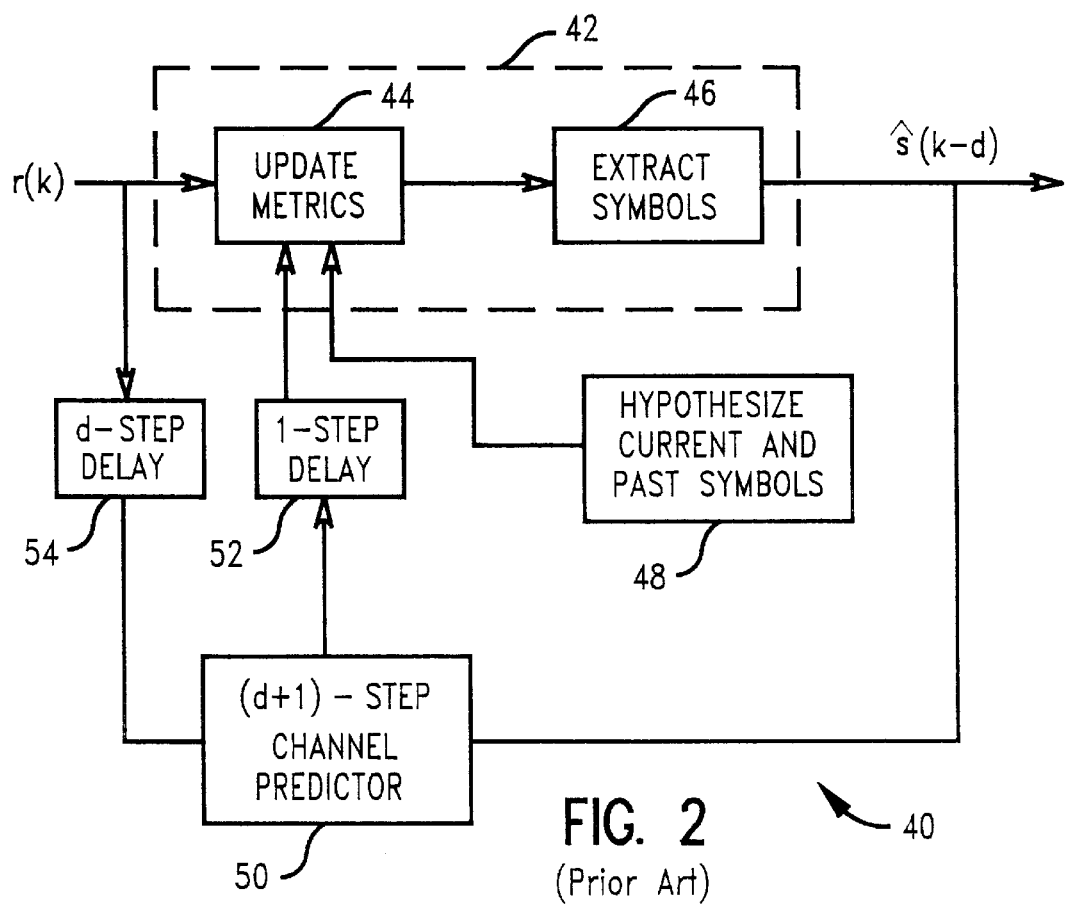
FIG. 2 is a block diagram of a prior art adaptive MLSE baseband processor using decision feedback.

The prior art baseband processor 40, shown in FIG. 2, operates according to the above-described example for coherent MLSE reception using decision feedback channel estimation. The received sample r(k) is provided to a sequence estimator 42, including an update metrics unit 44 and an extract symbols unit 46. The sequence estimator 42 performs sequence estimation, e.g., using a Viterbi algorithm, for determining the most likely transmitted symbol sequence from the received sample r(k).

Current and past hypothetical symbol values are developed by a hypothesize current and past symbols unit 48. The current and past hypothetical symbol values are developed by, for example, application of a Viterbi algorithm, wherein each state transition corresponds to a set of current and past hypothetical symbol values which can be extracted from a look-up table. The operation of a Viterbi algorithm to generate, test, discard and retain symbol sequence hypotheses is explained, for example, in U.S. Pat. Nos. 5,331,666, 5,577,068, 5,335,250 and 5,557,645, the disclosures of which are hereby incorporated by reference herein.

Predicted channel coefficients are developed by a (d+1)-step channel predictor 50. The update metrics unit 44 receives the current and past hypothetical symbol values from the hypothesize current and past symbols unit 48 and the predicted channel coefficients from the (d+1)-step channel predictor 50, after being delayed by a 1-step delay unit 52, and computes branch metrics and updates the path metrics (the accumulated branch metrics) for each set of channel estimates and hypothesized symbol values. The path metrics are received by the extract symbols unit 46, which determines the best path metric, i.e., the path metric having the lowest value, and extracts detected symbol values ŝ(k−d) and ŝ(k−d−1) associated with that particular path metric. The detected symbol values ŝ(k−d) and ŝ(k−d−1) are provided to the (d+1)-step channel predictor 50. The (d+1)-step channel predictor 50 uses the detected symbol values and the received samples, after being delayed by a d-step delay unit 54, to predict the channel coefficients for the next iteration.

The amount of prediction can be reduced by using Per Survivor Processing (PSP) techniques. See, for example, U.S. Pat. No. 5,164,961 to Gudmundson, the disclosure of which is hereby incorporated by reference herein. After the current received sample and 1-step channel estimates are used for detection, channel estimates associated with each state in the Viterbi algorithm are updated for use with the next iteration. This improves performance, but is limited in that the 1-step prediction process is not always reliable when the channel is varying rapidly.

Specifically, the path metric updating process can be viewed as having "states" corresponding to past hypothetical symbol values. Associated with each state is a set of channel coefficient estimates. Since states correspond to symbol hypotheses up until, and including, time (k−1), received samples including r(k−1) can be used to form error signals and update the coefficients. Thus, only 1-step prediction is needed.

Figure 3:
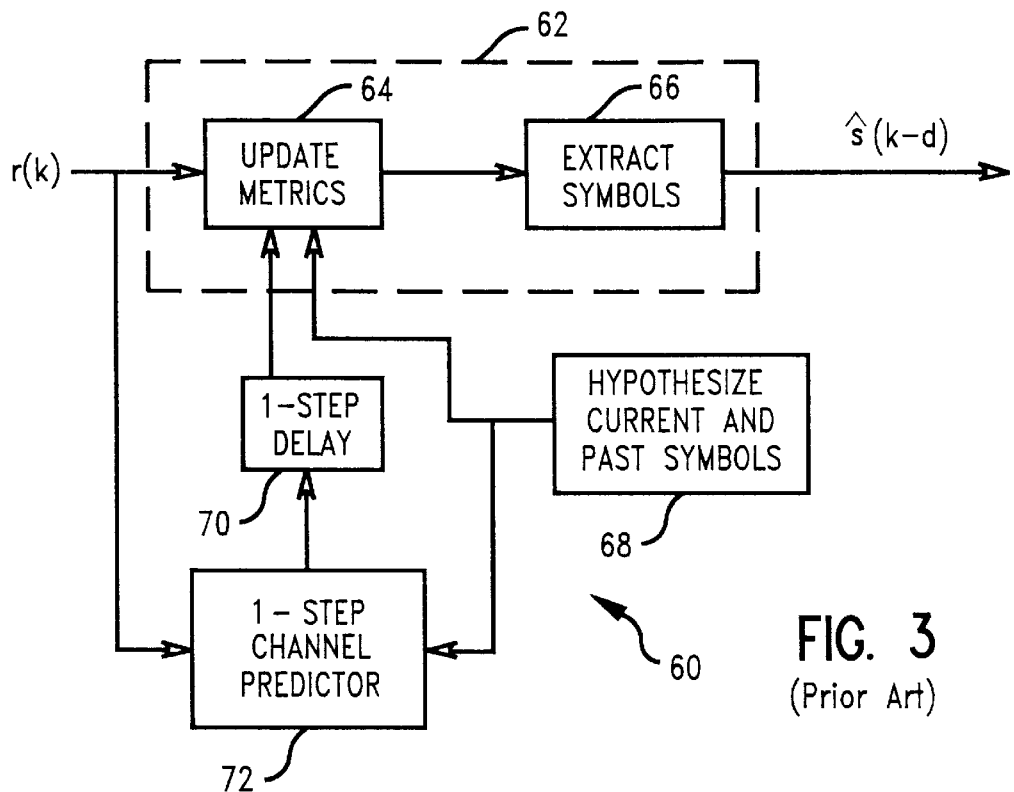
FIG. 3 is a block diagram of a prior art adaptive MLSE baseband processor using per survivor processing.

FIG. 3 illustrates a prior art baseband processor, shown generally at 60, which estimates channel coefficients utilizing PSP techniques. The received samples r(k) are provided to a sequence estimator 62, including an update metrics unit 64 and an extract symbols unit 66, along with hypothesized current and past symbols from a hypothesize current and past symbols unit 68 and delayed predicted channel coefficients from a 1-step delay unit 70. The sequence estimator 62 performs sequence estimation for determining the most likely transmitted symbol sequence from the received sample r(k). The 1-step delay unit 70 receives predicted channel coefficients from a 1-step channel predictor 72, which performs 1-step channel prediction based on the received samples r(k) and the hypothetical current and past symbol values developed by the hypothesize symbols unit 68. For a hypothetical pair of current and past symbol values corresponding to an updated state, the 1-step channel predictor unit 72 develops a channel coefficient predicted value. The update metrics unit 64 receives the current and past hypothetical symbol values from the hypothesize current and past symbols unit 68 and the predicted channel coefficients from the 1-step channel predictor unit 72, after being delayed by the 1-step delay unit 70, and computes branch metrics and updates the path metrics. The path metrics are provided to the extract symbols unit 66 which determines the best path metric, i.e., the path metric having the lowest value, and extracts detected symbol values ŝ(k−d).

Delay of the predicted channel coefficients by the 1-step delay unit 70 in essence results in using channel estimates (predicted channel coefficients) for time (k−1), predicted using up to r(k−1), in computing the path metrics for time k. Thus, the prior art baseband processor 60 shown in FIG. 3 detects symbol values ŝ(k−d) by first updating the path metrics for time k using channel estimates for time (k−1), and then updating the channel estimate for time k. The updated channel estimate at time k is used to update the path metrics for time (k+1), etc.

Per Survivor Processing has also been used to track phase changes in the received signal. Still, PSP techniques require some prediction. The impact of incorrect symbols in the path history can be reduced by keeping multiple channel models per state, corresponding to multiple past symbol sequence hypotheses. However, the limitations of prediction remain.

In U.S. Pat. No. 5,557,645 to Applicant, it is disclosed that equations (2)–(6) can be combined to obtain an MLSE metric from which the channel estimates have been eliminated, the MSLE metric being only a function of the received signal samples and the hypothesized current and past symbols. Due to the eliminated channel estimates having been dependent on all of the hypothesized symbol history to date, the MLSE metric functions depend on all of the symbol history and thus permit the use of as many "states" as desired, in which a large number of past symbols are retained in all of their combinations even when a received signal sample depends only on a few most recent symbols. However, the metric disclosed in the '645 Patent has an asymmetrical or causal time dependence only on past symbols and not on future symbols. Specifically, all symbols up to, but not beyond, symbol s(k) are used to form a metric from the received sample r(k). Thus the implicit channel estimation contained within that metric depends as much on history as desired, but not on any future hypothesis.

By contrast, the present invention contemplates developing a channel estimate using future symbol hypotheses, namely, signal sample r(k+1) and hypotheses of symbol s(k+1) or beyond, for forming the metric for time k. Even forming a channel estimate first, using r(k) and s(k), and then using the estimate in computing the metric for time k is within the scope of the present invention and beyond the scope of the prior art, which only contemplates using up to r(k−1) and s(k−1) in forming a channel estimate for use at time k.

As described above, in order to improve channel tracking performance it would be useful, when processing the k'th received sample, to be able to use channel coefficient estimates that had the benefit of knowing the current and future symbol values ŝ(k), ŝ(k+), . . . Then, a smoothed estimate of the channel coefficients could be used, based on past and future received signal values. Since the current and future symbol values are not known, they are hypothesized according to exemplary embodiments of the present invention. The invention can be characterized as "look-ahead" parameter estimation, in which L symbols (the current symbol and L−1 future symbols) are hypothesized to allow improved channel estimation.

Normally, symbols are only hypothesized when they contribute significant ISI (Inter Symbol Interference) to the received sample being processed. For example, with adaptive prior art PSP MLSE receivers, current and past symbols are hypothesized, metrics are updated, then channel estimates are updated for the different hypotheses. With the present invention, future symbols are hypothesized in order to better estimate the channel, even though they may not contribute to the signal sample currently being processed.

Also, channel estimation is performed before the metrics are computed, in contrast to prior art techniques.

Figure 4:
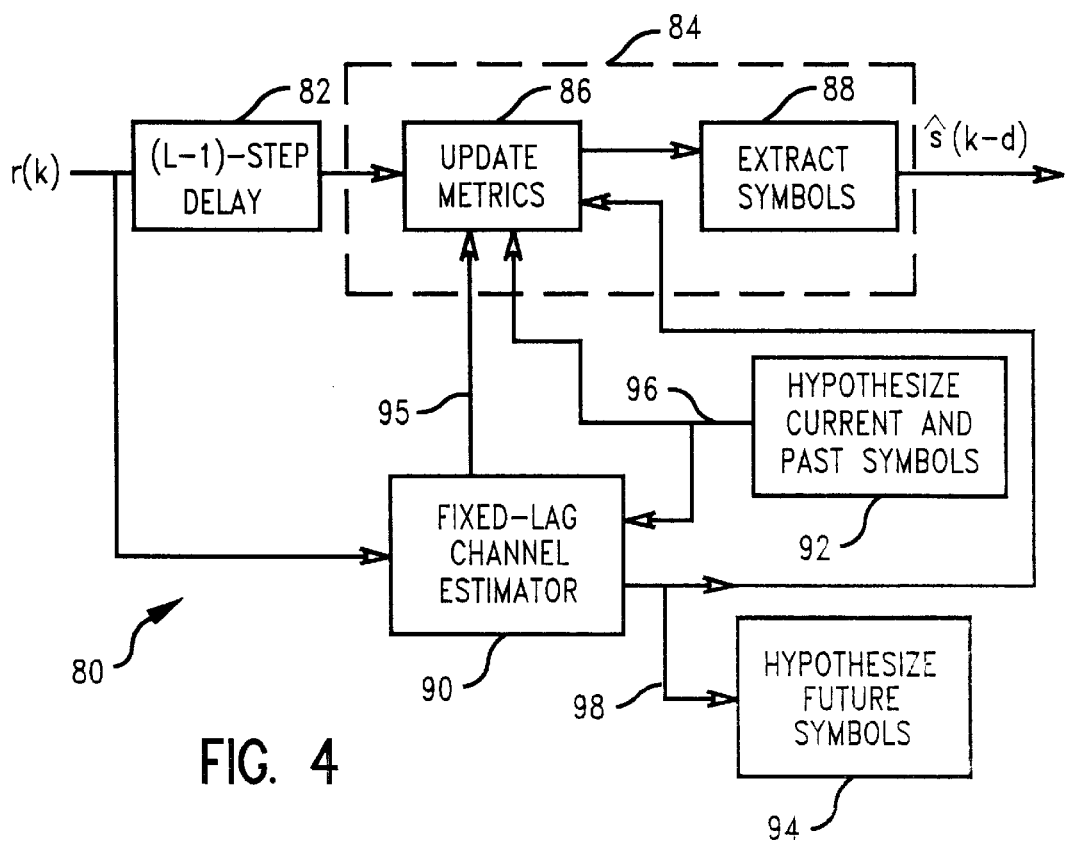
FIG. 4 is a block diagram of an adaptive MLSE baseband processor according to the present invention.

An exemplary baseband processor 80 according to the present invention is shown in FIG. 4. When used in the wireless communications system 10 shown in FIG. 1, the baseband processor 80 replaces the prior art processor 26. The baseband processor 80 includes an (L−1)-step delay unit 82, a sequence estimator 84, including an update metrics unit 86 and an extract symbols unit 88, a fixed-lag channel estimator 90, a hypothesize current and past symbols unit 92 and a hypothesize future symbols unit 94. The received samples r(k) are provided to the (L−1)-step delay unit 82, which delays the values (L−1) symbol periods, i.e., the number of symbol periods corresponding to the number of future symbols to be hypothesized. The received samples r(k) are also provided, undelayed, to the fixed-lag channel estimator 90. The fixed-lag channel estimator 90 develops channel estimates at 95 based on the received samples r(k) and hypothesized symbol values 96 and 98 from the hypothesize current and past symbols unit 92 and the hypothesize future symbols unit 94, respectively. The delayed received samples from the (L−1)-step delay unit 82 are provided to the update metrics unit 86 which operates to calculate branch metrics and update path metrics using input from the hypothesize current and past symbols unit 9 and the fixed-lag channel estimator 90. The calculated path metrics from the update metrics unit 86 are provided to the extract symbols unit 88 which determines the best path, i.e., the path metric having the lowest value, and extracts detected symbol values ŝ(k−d). Since the received samples are not delayed when provided to the fixed-lag channel estimator 90, at some given time T when a particular sample r(k) is being used for metric updating in the update metrics unit 86, the channel estimates supplied thereto from the estimator 90 are based upon received samples up to, and including, sample r(k+L).

Channel estimation occurs in the estimator 90 before the path metrics are updated by the update metrics unit 86. Thus, even if the baseband processor 80 is not hypothesizing future symbols to perform channel estimation, i.e., if L=1, baseband processors according to the present invention still differ from conventional PSP MLSE processors in that the channel is updated (i.e., channel estimation is performed) prior to metric updating. This, in turn, means that each branch metric calculated in the update metrics unit 86 uses a different channel estimate, as compared with conventional MLSE operation, wherein several branch metrics use the same channel estimates.

In essence, with prior art PSP, there is a channel model corresponding to each state in the Viterbi algorithm. Thus, the prior art channel model depends only on past symbol values. Accordingly, two metrics which correspond to the same past symbol values, but different current symbol values, would be based on the same channel estimates. In contrast, with the inventive baseband processor 80 and L=1, there are different channel estimates for each combination of past and current symbol values. Thus, two metrics corresponding to the same past symbol values but different current symbol values would be based on different channel estimates.

The fixed-lag channel estimator 90 uses the set of current and past hypothesized symbol values 96 produced by the hypothesize current and past symbols unit 92, and the set of hypothesized future symbol values 98 produced by the hypothesize future symbols unit 94. The update metrics unit 86, on the other hand, uses only the set of current and past hypothesized symbol values 96 produced by the hypothesize current and past symbols unit 92 when computing f̂(k).

However, estimates used to compute f̂(k) also depend on hypothetical future symbols. Therefore, according to the present invention, the "state", as defined herein, now includes both present and future symbol values. For example, with binary modulation and a two-tap channel model, conventional MLSE reception has two states in the Viterbi algorithm corresponding to the two possible values for the past symbol value (+1 and −1). With the present invention and with L=1, there are now four states in the Viterbi algorithm, corresponding to all combinations of the past and current symbol values, i.e., +1+1, +1−1, −1+1, and −1−1. With L=2, there are eight states in the Viterbi algorithm, corresponding to all possible combinations of the past, current, and future symbol values, i.e., +1+1+1, +1+1−1, +1−1+1, +1−1−1, −1+1+1, −1+1−1, −1−1+1, and −1−1−1. With L=3, there are sixteen states in the Viterbi algorithm, etc.

Figure 5:
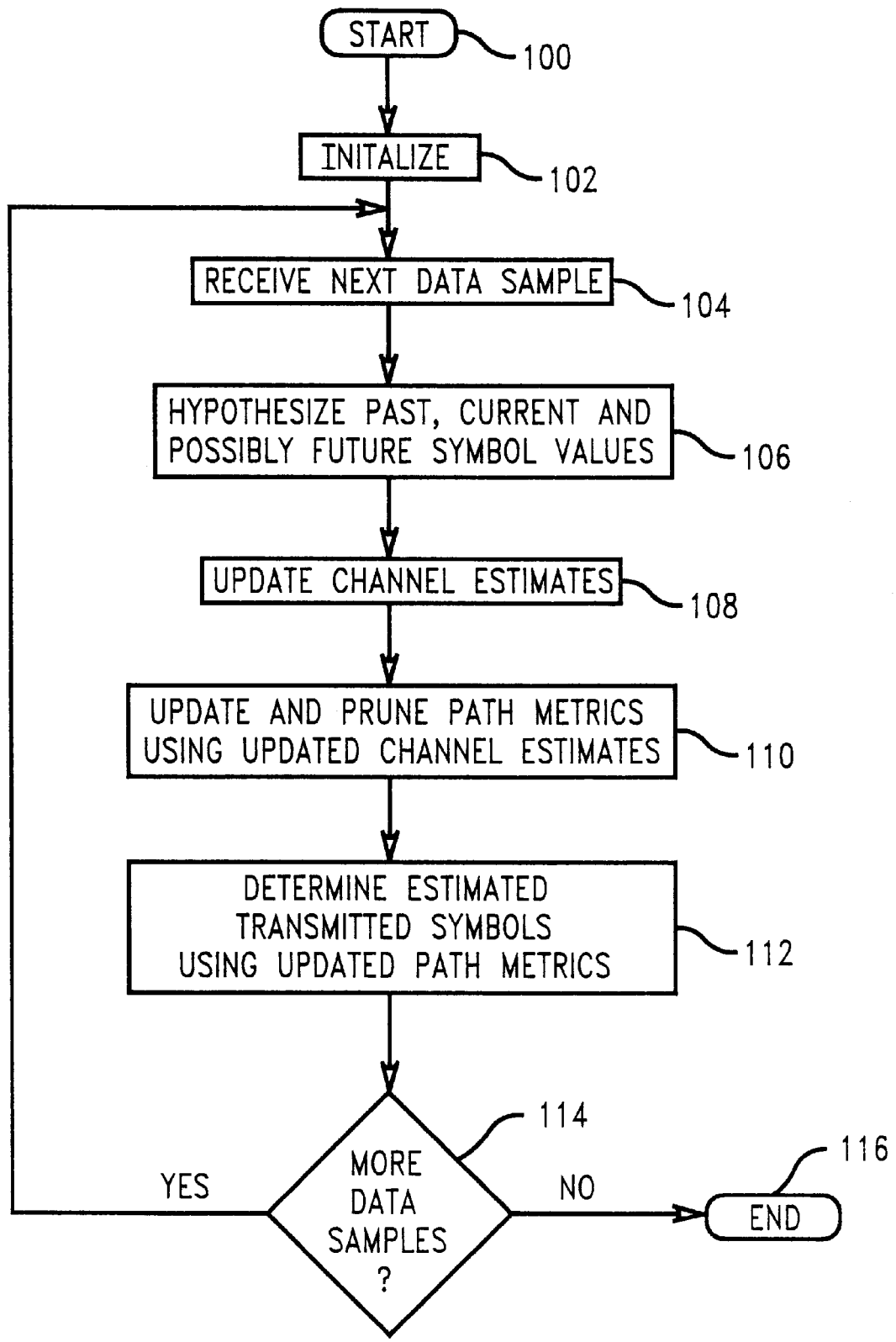
FIG. 5 is a flow chart illustrating a process for adaptive MLSE baseband processing according to the present invention.

An exemplary process of operation of the baseband processor 80 according to the present invention is shown in the flow chart of FIG. 5. The process starts at block 100 upon a signal being received. Path metrics are initialized by the update metrics unit 86, at block 102. For example, if there are known training symbols provided in the received signal prior to the unknown data symbols, the update metrics unit 86 initializes the path metrics to favor the known symbol values. A data sample is received by the baseband processor 80 for processing, at block 104. The data sample may be the first data sample after the training symbols, or may be the next data sample in the plurality of data symbols received. Past, current and possibly future symbol values are hypothesized by the hypothesize current and past symbols unit 92 and the hypothesize future symbols unit 94, at block 106. Whether or not future symbols are hypothesized depends on the value of L. With L=1, only current and past symbols are hypothesized. With L=2, current, past and future symbols are hypothesized. With L=3, current, past and two future symbols are hypothesized, etc. With the hypothesized symbol values (past, current and possibly future) and the current data sample, sets of channel estimates are updated by the fixed-lag channel estimator 90, at block 108. The updated sets of channel estimates are used, along with the hypothesized current and past symbol values, by the update metrics unit 86 to update and prune path metrics using, for example, a Viterbi algorithm, at block 110. Those skilled in the art will appreciate that other pruning algorithms, such as an M-algorithm may be used as well. The updated path metrics are received by the extract symbols unit 88 which determines estimated values for the transmitted symbols using the updated path metrics, at block 112. If more data samples are to be processed, as determined at block 114, the process returns to block 104 and the data sample is received and processed. If no more data samples are to be processed, as determined at block 114, the process ends at block 116.

Figure 6:
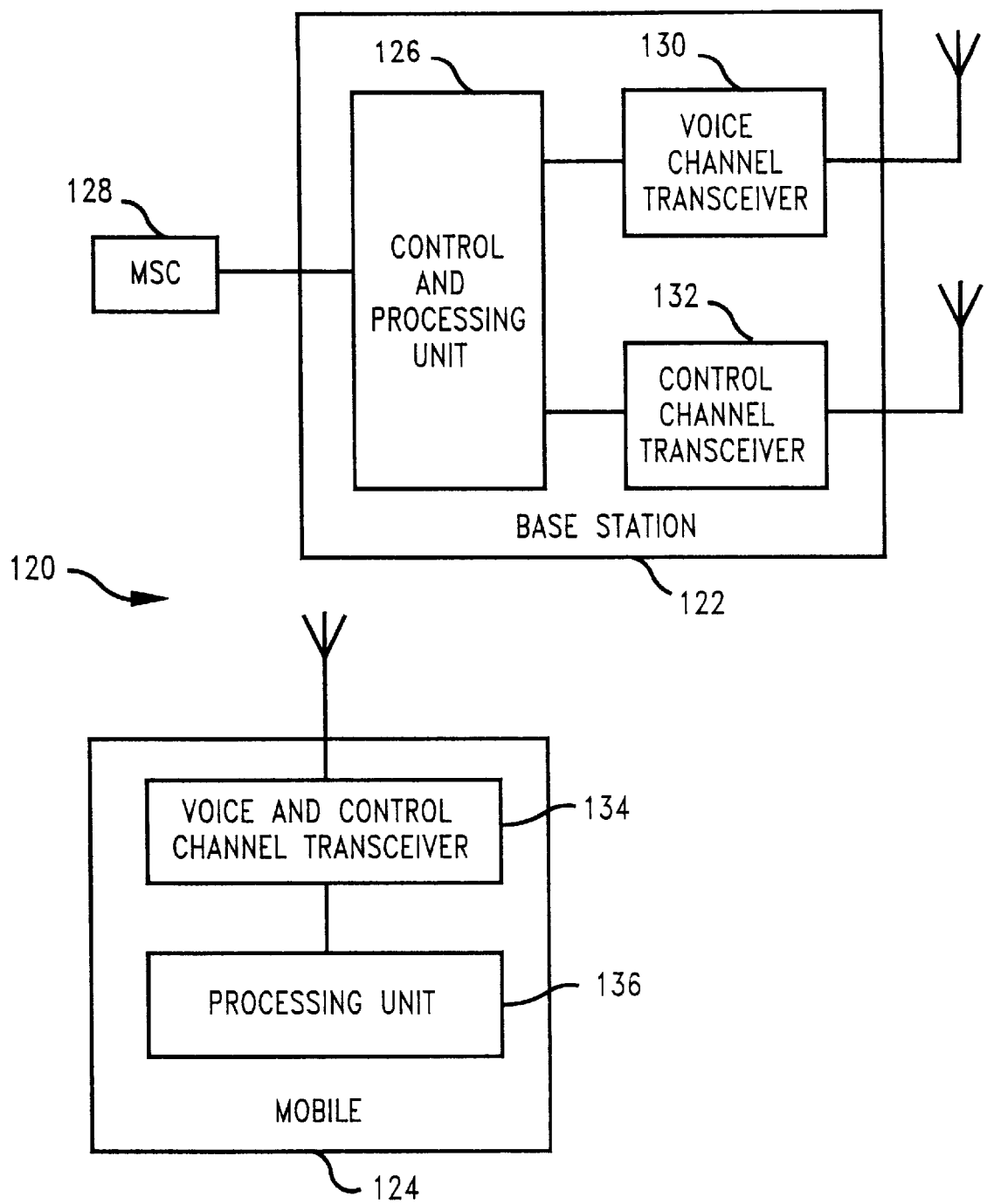
FIG. 6 is a block diagram of an exemplary portion of a cellular radiocommunication system in which the inventive baseband processor may be implemented.

Although the present invention can be employed in other applications, e.g., wireline applications, it has particular utility in wireless communications systems, e.g., cellular systems including mobile and base stations. To illustrate this point, consider the exemplary embodiment of FIG. 6 which represents a block diagram of an exemplary cellular mobile radiotelephone system, shown generally at 120, including an exemplary base station 122 and mobile station 124. The base station 122 includes a control and processing unit 126, including the inventive baseband processor 70 (not shown), which is connected to an MSC (Mobile Switching Center) 128, which in turn is connected to a PSTN (Public Switching Telephone Network) (not shown). General aspects of such cellular radiotelephone systems are known in the art, as described by U.S. Pat. No. 5,175,867 to Wejke et al., entitled "Neighbor-Assisted Handoff in a Cellular Communication System," and U.S. patent application Ser. No. 07/967,027, filed Oct. 27, 1992 and entitled "Multi-mode Signal Processing," both disclosures of which are hereby incorporated by reference herein.

The base station 122 handles a plurality of voice channels through a voice channel transceiver 130, which is controlled by the control and processing unit 126. Also, the base station 122 includes a control channel transceiver 132, which is capable of handling more than one control channel. The control channel transceiver 132 is also controlled by the control and processing unit 126. The control channel transceiver 132 broadcasts control information over the control channel of the base station 122 to mobiles within its cell, or range of coverage, and locked to that control channel. It will be understood that the transceivers 130 and 132 can be implemented as a single device for use with DCCHs (Dedicated Control Channels) and DTCs (Digital Traffic Channels) that share the same radio carrier frequency.

The mobile station 124 receives the information broadcast on the control channel at a voice and control channel transceiver 134. A processing unit 136, including the inventive baseband processor 70 (not shown), evaluates the received control channel information, which includes the characteristics of cells, i.e., base stations, that are candidates for the mobile station 124 to lock on to, and determines on which cell the mobile 124 should lock. Advantageously, the received control channel information not only includes absolute inforrnation concerning the cell with which it is associated, but also contains relative information concerning other cells proximate to the cell with which the control channel is associated. The generation, receipt and use of such control channel information is described in U.S. Pat. No. 5,353,332 to Raith et al., entitled "Method and Apparatus for Communication Control in a Radiotelephone System," the disclosure of which is hereby incorporated by reference herein.

The foregoing exemplary embodiment of the present invention has been described with respect to MLSE equalization wherein the metric employed by the update metrics unit 86 is the Euclidean distance metric. The "detection statistic" for such receivers is simply the received baseband samples. However, those skilled in the art will appreciate that the present invention is also applicable to other forms of adaptive equalization and/or MLSE equalization using other metrics. For example, the present invention can be used with an MLSE equalization technique wherein the metric employed by the update metrics unit is the Ungerboeck metric, which uses channel estimates to filter multiple received samples as well as "s-parameters." For more information regarding this type of MLSE equalization technique, see G. Ungerboeck, "Adaptive Maximum Likelihood Receiver for Carrier-Modulated Data Transmission Systems," IEEE Transactions in Communications, Vol. Com-22, pp. 624–646, May 1974, which is hereby incorporated by reference herein. The s-parameters can be estimated either directly or indirectly using the channel estimates from the fixed-lag channel estimator 90. In any event, each iteration is still associated with a particular "current" symbol period. Thus, for the two-tap channel model described previously, the k'th symbol is processed using received samples r(k) and r(k+1) to form a current detection statistic as follows:

$$z(k) = \hat{c}_0^*(k) r(k) + \hat{c}_1^*(k) r(k+1). \tag{10}$$

Equation (10) is the commonly used approximation to the true expression $$z(k) = \hat{c}_0^*(k) r(k) + \hat{c}_1^*(k+1) r(k+1), \tag{11}$$

which was employed because the "future" value $\hat{c}_1^*(k+1)$ was not yet available. The present invention, however, facilitates the use of the more exact equation (11). Thus, for this exemplary embodiment, r(k+1) would be the "current" received sample and s(k) would be the "current" symbol. With traditional PSP adaptation, the channel estimates are updated after iteration k using hypothesized values for the k'th symbol and past symbols. With the present invention, future symbols would also be hypothesized and the detection statistic would be improved by using $\hat{c}_1(k+1)$ in equation (11) instead of $\hat{c}_1(k)$ in equation (10).

Moreover, the present invention is not limited to MLSE equalization applications, but is also applicable to adaptive Decision Feedback Equalization (DFE) and Linear Equalization (LE). Metrics can be formed, such as the difference squared between the soft and hard decision values, for use in pruning the channel estimates. For LE, the metric forming parameters could be filter coefficients. For DFE, the metric forming parameters could be feedforward or feedback filter coefficients.

In addition, the present invention may be used with any coherent detector. For example, if the received signal is modeled as:

$$r(k) = c(k) s(k) + n(k), \tag{12}$$

then the traditional adaptive coherent detector would form the detection statistic:

$$y(k) = \hat{c}^*(k) r(k). \tag{13}$$

The detected symbol, ŝ(k), is then the symbol closest to the detection statistic y(k), e.g., the sign of the real part of y(k) for BPSK (Binary Phase Shift Keying) modulation. Traditional channel tracking would then predict the channel tap for the next iteration, i.e., form $\hat{c}(k+1)$, using an error signal $r(k) - \hat{c}(k)\hat{s}(k)$ and the current estimate $\hat{c}(k)$. Observe that with this application, there is no need for hypothesizing symbols or forming path metrics.

According to other exemplary coherent detection embodiments of the present invention, the current symbol (L=1) and possibly future symbols (L>1) are hypothesized by units 92 and 94, respectively, forming a state space trellis. For each hypothesis, channel estimates are formed by the estimator 90 and used by the sequence estimator 84 for symbol detection. This is a simplification of the earlier example, in which $c_0(k) = c(k)$ and $c_1(k) = 0$.

Consider the exemplary case of L=1 and BPSK modulation. Coherent detection according to the present invention operates as follows. First, the current symbol is hypothesized to be +1, and one channel estimate is formed:

$$\hat{c}(k,+1) = \hat{c}(k-1) + \mu(+1)(r(k) - \hat{c}(k-1)(+1)). \tag{14}$$

A metric is also formed:

$$J(+1) = |r(k) - \hat{c}(k,+1)(+1)|^2. \tag{15}$$

A channel estimate and metric are also formed for the current symbol hypothesis of −1 as well. Whichever metric is smaller indicates the detected symbol as well as which channel estimate becomes ĉ(k).

Alternatively, the metric used for pruning channel taps may be different from the metric that is used to detect the transmitted bits. For example, the metric above could be used for channel model pruning, whereas the detected symbol could be determined by the sign of the decision statistic:

$$z(k)=\hat{c}^*(k,\text{selected})r(k). \tag{16}$$

The statistic $z(k)$ may also be used as a soft value.

The metrics used for channel estimation can have a variety of forms. For example, a mean square error metric can be used by taking the magnitude squared of the difference between the channel estimate and an instantaneous value $\hat{d}(k)$ obtained using:

$$\hat{d}(k)=\hat{s}^*(k)r(k). \tag{17}$$

The present invention is also applicable to systems which include antenna arrays. For example, it can be used with Interference Rejection Combining (IRC), as discussed in U.S. Pat. No. 5,680,419 to Bottomley, the disclosure of which is hereby incorporated by reference herein. The present invention can also be used in adaptive antenna combining, allowing combining weights to benefit from better estimation.

Figure 7:
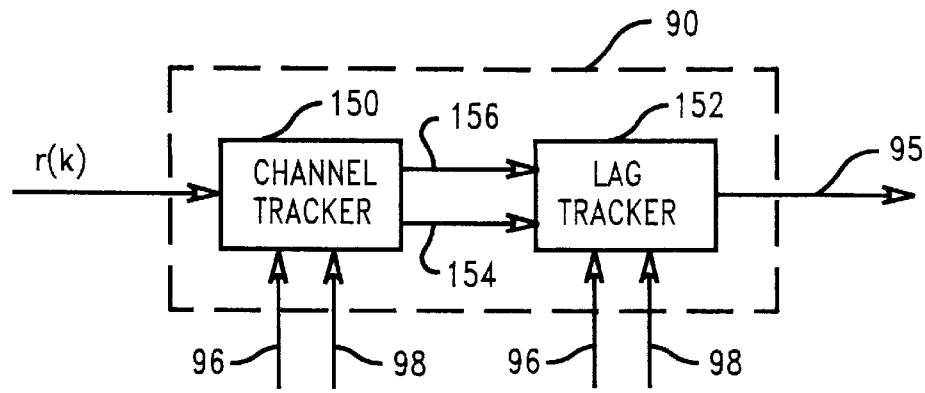
FIG. 7 is a block diagram of a first embodiment of the fixed-lag channel estimator shown in FIG. 4.

FIG. 7 illustrates a preferred embodiment of the fixed-lag channel estimator 90 shown in FIG. 4, including a channel tracker 150 and a lag tracker 152. The received samples $r(k)$ are received by the channel tracker 150 along with the hypothesized current and past symbol values 96 and the hypothesized future symbol values 98. The channel tracker 150, using any of a plurality of channel tracking algorithms to be described in detail infra, develops a channel estimate 154 and an error signal 156. The error signal 156 may be an intermediate signal related to the error signal, or may simply be the error signal itself $e(k,k-1)$.

The lag tracker 152 receives the channel estimate 154 and the error signal 156, along with the hypothesized current and past symbol values 96 and the hypothesized future symbol values 98, and develops a fixed-lag estimate of the channel at the signal 95, which is input to the sequence estimator 84 (see FIG. 4).

Various channel tracking algorithms can be utilized by the channel tracker 150, including, but not limited to, Kalman, LMS (Least Mean Square), KLMS (Kalman Least Mean Square) and RLS (Recursive Least Square) tracking algorithms.

For Kalman filtering, standard one-step prediction can be expressed in terms of measurement and time update equations for the state vector $x$ and the error covariance matrix $P$ as follows:

$$\hat{x}(k,k)=\hat{x}(k,k-1)+P(k,k-1)H(k)[H^H(k)P(k,k-1)H(k)+R(k)]^{-1}e(k,k-1), \tag{18}$$

$$\hat{x}(k+1,k)=F(k)\hat{x}(k,k), \tag{19}$$

$$P(k,k)=P(k,k-1)-P(k,k-1)H(k)[H^H(k)P(k,k-1)H(k)+R(k)]^{-1}H^H(k)P(k,k-1), \tag{20}$$

$$P(k+1,k)=F(k)P(k,k)F^H(k)+G(k)Q(k)G^H(k), \tag{21}$$

where $$e(k,k-1)=y(k)-H^H(k)\hat{x}(k,k-1). \tag{22}$$

In the above equations (18–22), $y(k)$ is the measured data $(y(k)=H^H(k)x(k)+v(k)$, where $v(k)$ is the measurement noise); $R(k)$ is the measurement noise covariance matrix (measurement noise power for a single measurement channel); $H^H(k)$ maps the state at time $k$ to the theoretical noiseless measurement, with the superscript $H$ indicating a Hermitian transpose; $F(k)$ maps the current state to the next state $(x(k+1)=F(k)x(k)+w(k)$, where $w(k)$ is the plant noise); and $Q(k)$ is the plant noise covariance matrix.

For Kalman channel tracking, the state $x$ is defined to include the channel coefficients $c$. Here, an alternative received signal model is used, so that $$r(k)=c_0^*(k)s(k)+c_1^*(k)s(k-1)+n(k). \tag{23}$$

Notice that in equation (23), unlike in equation (1), the channel coefficients $c_0$ and $c_1$ are conjugated.

Depending on the particular signal model utilized, the channel coefficients could include related quantities, such as derivatives of the channel coefficients. Considering a simple random walk model for the channel coefficients $c$, which are assumed to be uncoupled, for a two-tap channel model the state vector $x(k)$ is defined as $x(k)=c(k)=[c_0(k)c_1(k)]^T$. The state vector is also coupled to the measurement noise via the symbol values, i.e., $$H(k)=[s(k)s(k-1)]^T=s(k). \tag{24}$$

Utilizing the Kalman filtering equations with $y(k)=r^*(k)$, $R(k)=\sigma_v^2$, $G(k)Q(k)G^H(k)=\sigma_p^2 I$ and $F(k)=I$, the channel tracker 150 develops the channel estimate 154 as $$\hat{c}(k+1,k)=\hat{c}(k,k-1)+K(k)e(k,k-1), \tag{25}$$

where $$K(k)=P(k,k-1)s(k)[s^H(k)P(k,k-1)s(k)+\sigma_v^2]^{-1}, \tag{26}$$

and $$P(k+1,k)=P(k,k-1)-P(k,k-1)s(k)[s^H(k)P(k,k-1)s(k)+\sigma_v^2]^{-1}s^H(k)P(k,k-1)+\sigma_p^2 I, \tag{27}$$

and where the error signal 156 is developed as $$e(k,k-1)=r^*(k)-\hat{c}_0(k,k-1)s^*(k)-\hat{c}_1(k,k-1)s^*(k-1)=(r(k)-c^H(k,k-1)s(k))^*. \tag{28}$$

For N-lag channel estimation using the Kalman tracking algorithm, the lag tracker 152 develops the fixed-lag channel estimates 95 utilizing the following equation for $i=1$ through $N$:

$$\hat{c}(k-i,k)=\hat{c}(k-i,k-1)+P(k-i,k-i-1)e(k,i+1), \tag{29}$$

where $$e(k,i+1)=[I-K(k-i)s^H(k-i)]^H e(k,i), \tag{30}$$

and $$e(k,1)=s(k)[s^H(k)P(k,k-1)s(k)+\sigma_v^2]^{-1}e(k,k-1). \tag{31}$$

Utilizing this form of Kalman channel tracking, lag-1 through lag-N channel estimates may be produced by the fixed-lag channel estimator 90. Depending on the specific application, this may be valuable. For example, in an IS-95 system, a different amount of delay may be tolerated for the traffic data bits than for the power control bits. Different lag-N channel estimates, corresponding to the different tolerated symbol period delays, could be used to demodulate the traffic bits and the power control bits. If only a lag-N channel estimate is needed, then the intermediate terms corresponding to the lag-1 through lag-(N−1) channel estimates can be eliminated utilizing the update formula:

$$\hat{c}(k-N,k)=\hat{c}(k-N,k-N)+P(k-N,k-N-1)\Sigma_{i=1}^N e(k+i-N,i+1). \tag{32}$$

Depending on the tracking algorithm used by the channel tracker 150, the lag tracker 152 may take various forms.

Figure 8:
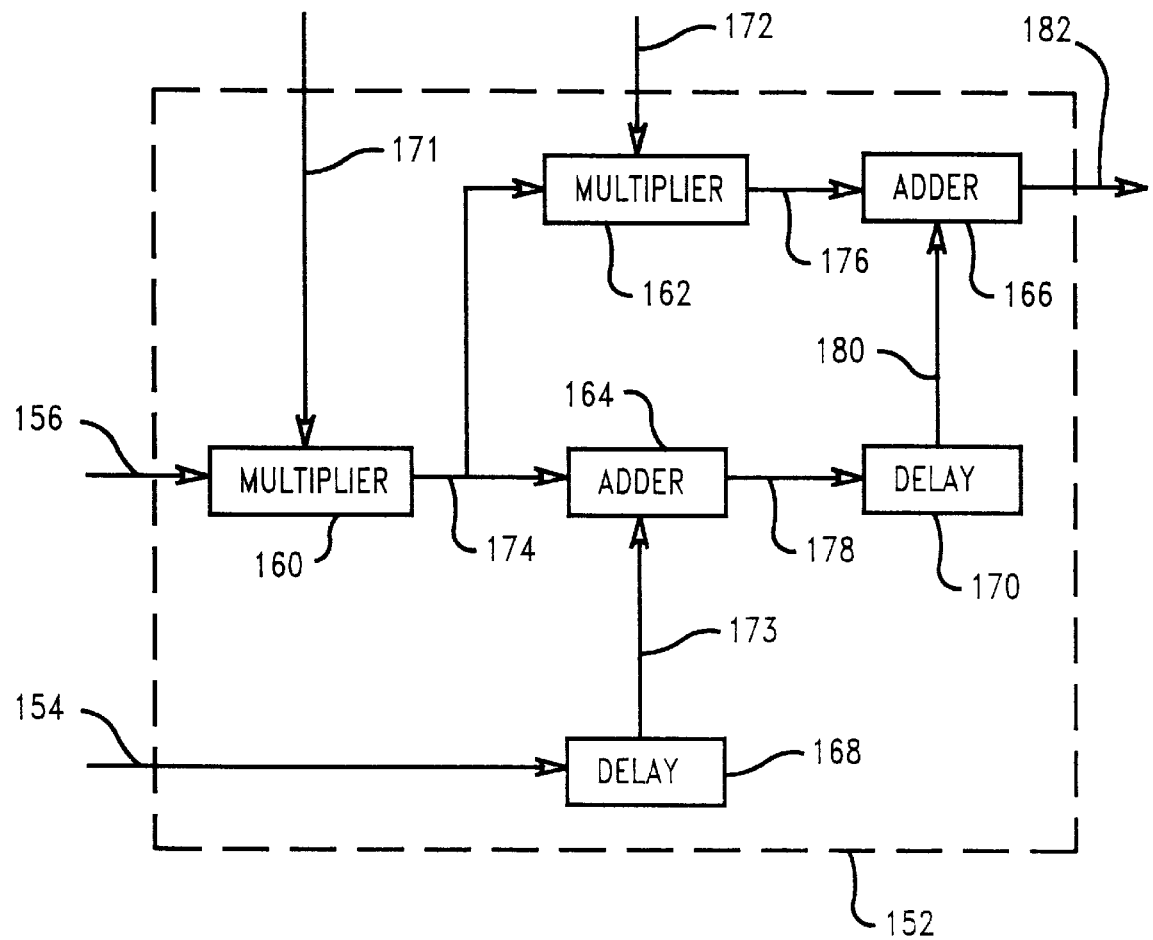
FIG. 8 is a block diagram of a first embodiment of the lag tracker shown in FIG. 7 using Kalman tracking theory.

FIG. 8 illustrates a first embodiment of the lag tracker 152 used in Kalman channel tracking, including multipliers 160 and 162, adders 164 and 166, and delay units 168 and 170. The multipliers 160 and 162 receive hypothesized symbol values at signals 171 and 172, respectively. The hypothesized symbol values 171 received by the multiplier 160 include the most futuristic hypothe-sized symbol and all prior hypothesized symbols, while the hypothesized symbols 172 received by the multiplier 162 are simply the hypothesized symbols 171 shifted back one symbol period.

The channel estimate 154 is delayed one update period by the delay unit 168, producing a delayed channel estimate 173. The multiplier 160 multiplies the error signal 156 by a multiplier producing a modified error signal 174. For Kalman lag-2 channel tracking, the multiplier preferably corresponds to the matrix:

$$[I-K(k-1)s^H(k-1)]^H, \quad (33)$$

so that the modified error signal 174 output by the multiplier 160 corresponds to e(k,2), which is the error signal provided in Equation (30) with i=1. Similarly, the multiplier 162 multiplies the modified error signal 174 to produce a further modified error signal 176 corresponding to e(k,3), which is the error signal provided in Equation (30) with i=2. The delayed channel estimate 173 and the modified error signal 174 are added in the adder 164 to produce a lag-1 channel estimate 178. The lag-1 channel estimate 178 is delayed one update period by the delay unit 170 producing a delayed lag-1 channel estimate 180. The further modified error signal 176 and the delayed lag-1 channel estimate are added in the adder 166 to produce a lag-2 channel estimate 182 output by the lag tracker 152 as the fixed-lag channel estimate 95 (see FIGS. 4 and 7).

Figure 9:
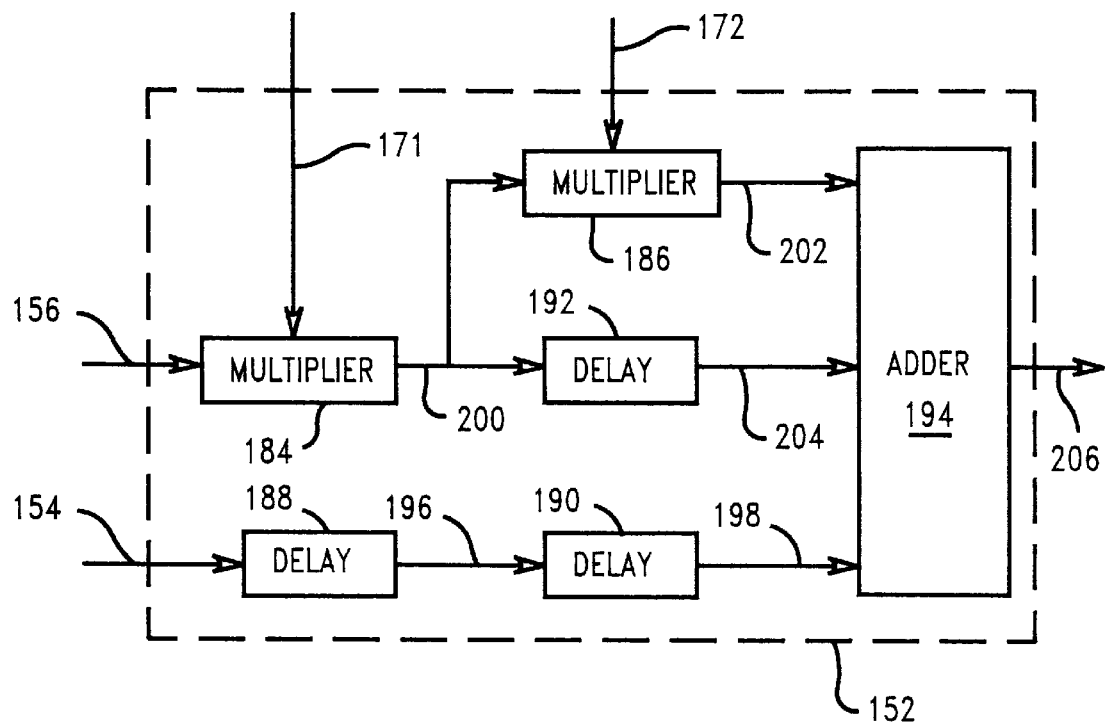
FIG. 9 is a block diagram of an alternative embodiment of the lag tracker shown in FIG. 7 using Kalman tracking theory.

FIG. 9 illustrates an alternative embodiment of the lag tracker 152 used in Kalman channel tracking, including multipliers 184 and 186, delay units 188, 190 and 192, and an adder 194. Similar to FIG. 8, the multiplier 184 receives the hypothesized symbol values 171 including the most futuristic hypothesized symbol and all prior hypothesized symbols, while the multiplier 186 receives hypothesized symbol values 172, which are simply the hypothesized symbols 171 shifted back one symbol period.

The channel estimate 154 is delayed one update period by the delay unit 188 producing a delayed channel estimate 196. The delayed channel estimate 196 is delayed an additional update period by the delay unit 190 producing a further delayed channel estimate 198 delayed two update periods. Alternately, the delay units 188 and 190 may include a single unit delaying the channel estimate 154 two update periods. The error signal 156 is multiplied by the multiplier 184 producing a modified error signal 200 corresponding to e(k,2), which is the error signal in Equation (30) with i=1. Similarly, the multiplier 186 multiplies the modified error signal 200 to produce a further modified error signal 202 corresponding to e(k,3), which is the error signal in Equation (30) with i=2. The modified error signal 200 is also delayed one update period by the delay unit 192 producing a delayed modified error signal 204. The further delayed channel estimate 198, the further modified error signal 202 and the delayed modified error signal 204 are added in the adder 194 to produce a lag-2 channel estimate 206 which is output by the lag tracker 152 as the fixed-lag channel estimate 95 (see FIGS. 4 and 7).

For LMS channel tracking, the time-varying P matrix is approximated by a fixed, diagonal matrix with the sane value along the diagonal, i.e., $$P(k,k-1) \approx pI. \quad (34)$$

With this approximation using the LMS tracking algorithm, the channel estimate 154 output by the channel tracker 150 is given by:

$$ĉ(k+1,k)=ĉ(k,k-1)+K(k)e(k,k-1), \quad (35)$$

where e(k,k-1) is given in equation (26) and $$K(k)=\mu s(k). \quad (36)$$

For N-lag channel estimation using the LMS tracking algorithm, the lag tracker 152 develops the fixed-lag channel estimates 95 utilizing the following equation for i=1 through N:

$$ĉ(k-i,k)=ĉ(k-i,k-1)+ẽ(k,i+1), \quad (37)$$

where $$ẽ(k,i+1)=[I-\mu s(k-i)s^H(k-i)]ẽ(k,i), \quad (38)$$

and $$ẽ(k;1)=\mu s(k)e(k,k-1). \quad (39)$$

Alternatively, if only a lag-N channel estimate is needed, the fixed-lag channel estimate can be developed according to the formula:

$$ĉ(k-N,k) = ĉ(k-N,k-N) + \sum_{i=1}^{N} ẽ(k+i-N, i+1). \quad (40)$$

In an LMS channel tracker, generally ĉ(k,k)=ĉ(k+1,k). The error-related term is the term used to update the channel estimate in the LMS update step. The multipliers used to generate the modified error terms change only with past symbol values. For a pilot channel, these multipliers would all be the same fixed value. For pilot symbols, the symbol modulation can be pre-removed, so that fixed values can be used as well. An approximate LMS channel estimate can be obtained by taking the expected value of the error signals over the symbol values, which are typically uncorrelated. This produces an approximate channel estimate according to:

$$ĉ(k-i,k)=ĉ(k-i,k-1)+(1-\sigma_s^2\mu)^i\mu s(k)e(k,k-1), \quad (41)$$

which can also be realized as $$ĉ(k-N, k) = ĉ(k-N, k-N) + \quad (42)$$
$$\sum_{i=1}^{N}(1-\sigma_s^2\mu)^i\mu s(k+i-N)e(k+i-N, k+i-N-1).$$

Note that a $\sigma_s^2$ is equal to 1 for MPSK (M'ary Phase Shift Keying) modulation. In the case where there is only one channel coefficient, the approximate channel estimate provided above becomes exact and the multipliers become scaler multipliers instead of matrix multipliers.

For RLS channel tracking, the following assumptions are made:

$$R(k) = \sigma_v^2 = \lambda, \text{ and} \tag{43}$$

$$G(k)Q(k)G^H(k) = \left(\frac{1}{\lambda} - 1\right)\left(P(k, k-1) - \frac{P(k, k-1)H(k)H^H(k)P(k, k-1)}{\lambda + H^H(k)P(k, k-1)H(k)}\right). \tag{44}$$

Using the above estimates with the RLS tracking algorithm, the channel estimate 154 output by the channel tracker 150 is given by:

$$\hat{c}(k+1, k) = \hat{c}(k, k-1) + \frac{P(k, k-1)H(k)}{\lambda + H^H(k)P(k, k-1)H(k)} e(k, k-1), \tag{45}$$

with $$P(k+1, k) = \frac{1}{\lambda}\left(P(k, k-1) - \frac{P(k, k-1)H(k)H^H(k)P(k, k-1)}{\lambda + H^H(k)P(k, k-1)H(k)}\right), \tag{46}$$

where $$e(k,k-1) = r^*(k) - \hat{c}_0(k,k-1)s^*(k) - \hat{c}_1(k,k-1)s^*(k-1), \tag{47}$$

and $$H(k) = [s(k)s(k-1)]^T. \tag{48}$$

Channel updating can then be expressed in terms of the Kalman gain, given by:

$$K(k) = \frac{P(k, k-1)H(k)}{\lambda + H^H(k)P(k, k-1)H(k)} \tag{49}$$

so that $$\hat{c}(k+1,k) = \hat{c}(k,k-1) + K(k)e(k,k-1), \tag{50}$$

and $$P(k+1, k) = \frac{1}{\lambda}(P(k, k-1) - K(k)H^H(k)P(k, k-1)). \tag{51}$$

For N-lag channel tracking using the RLS tracking algorithm, the lag tracker 152 develops the fixed-lag channel estimates 95 for i=1 through N according to the formula:

$$\hat{c}(k-i,k) = \hat{c}(k-i,k-1) + P(k-i,k-i-1)e(k,i+1) \tag{52}$$

where $$e(k,i+1) = [I - K(k-i)s^H(k-i)]^H e(k,i) \tag{53}$$

and $$e(k,1) = s(k)[s^H(k)P(k,k-1)s(k) + \lambda]^{-1}e(k,k-1). \tag{54}$$

In KLMS channel trackers, the state vector consists of state pairs, with each pair associated with a channel tap. The first state in the pair is the channel coefficient, and the second state in the pair is related to the first. For example, in an IRW (Integrated Random Walk) KLMS channel tracker, the second state value is the derivative of the channel tap (first state value) and in an AR2 (Second Order Auto-Regressive) KLMS channel tracker, the second state value is a constant times the previous channel coefficient value (delayed version of first state value).

The channel taps are assumed to be uncoupled, so that the F matrix is block diagonal having the form:

$$F(k) = \begin{bmatrix} F_{2\times 2} & 0_{2\times 2} & \cdots \\ 0_{2\times 2} & F_{2\times 2} & \cdots \\ \vdots & \vdots & \ddots \end{bmatrix},$$

with $F_{2\times 2}$ depending on the second state in the pair.

The output of the KLMS channel tracker depends only on the channel coefficients, so that $H^H(k)$ can be expressed as:

$$H^H(k) = [s^*(k)0s^*(k-1)0\ldots] = [s^*(k)H_{2\times 1}^T s^*(k-1)H_{2\times 1}^T \ldots], \tag{56}$$

where $H_{2\times 1} = [1\ 0]^T$. Similar to the LMS channel trackers, the KLMS channel trackers approximate a Kalman filter using a fixed P matrix. However, since there are two state values associated with each channel tap, the P matrix is assumed to be block diagonal, i.e., $$P^*(k, k-1) \approx \begin{bmatrix} P_{2\times 2}(0) & 0_{2\times 2} & \cdots \\ 0_{2\times 2} & P_{2\times 2}(1) & \cdots \\ \vdots & \vdots & \ddots \end{bmatrix}, \tag{57}$$

where $P_{2\times 2}(j)$ is determined by the parameter settings and relative channel tap strengths and has the form:

$$P_{2\times 2}(j) = \begin{bmatrix} p_{11}(j) & p_{12}(j) \\ p_{21}(j) & p_{22}(j) \end{bmatrix}. \tag{58}$$

In KLMS trackers the channel tap states, represented by state vector x have the form:

$$\hat{x}(k+1,k) = F\hat{x}(k,k-1) + K(k)e(k,k-1), \tag{59}$$

where $$K(k) = \frac{FP}{\sigma_s^2 \sum_{j=0}^{J-1} p_{11}(j) + \sigma_v^2} H(k). \tag{60}$$

Since block structures are assumed, separate updates for each channel tap state can be made using a common error signal. For example, the tap j update has the form:

$$\hat{x}_{2\times 2}(k+1,k;j) = F_{2\times 2}\hat{x}_{2\times 2}(k,k-1;j) + L_{2\times 1}(j)s(k-j)e(k,k-1), \tag{61}$$

where $$L_{2\times 1}(j) = \frac{F_{2\times 2}P_{2\times 2}(j)}{\sigma_s^2 \sum_{j=0}^{J-1} p_{11}(j) + \sigma_v^2} H_{2\times 1} = \begin{bmatrix} \mu_j \\ \alpha_j \end{bmatrix}. \tag{62}$$

Thus, each channel tap has two step sizes associated with it, namely, $\mu_j$ and $\alpha_j$. The Kalman gain of the entire state update (all taps) an be expressed as:

$$K(k) = \begin{bmatrix} L_{2\times 1}(1)s(k) \\ L_{2\times 1}(1)s(k-1) \\ \vdots \end{bmatrix}, \tag{63}$$

with the 0-step predicted value given by:

$$\hat{x}_{2\times 2}(k, k; j) = F_{2\times 2}^{-1} \hat{x}_{2\times 2}(k+1, k; j). \quad (64)$$

For N-lag channel estimation, one should consider updating all the channel coefficient states together. Accordingly, the following channel state equation is evaluated for i=1 through N:

$$\hat{x}(k-i,k) = \hat{x}(k-i,k-1) + Pe(k,i+1) \quad (65)$$

where $$e(k,i+1) = [F - K(k-i)H^H(k-i)]^H e(k,i+1) \quad (66)$$

and $$e(k,1) = H(k)[H^H(k)PH(k) + \sigma_v^2]^{-1} e(k,k-1) = P^{-1}F^{-1}K(k)e(k,k-1). \quad (67)$$

Due to the block diagonal structure of F and P, equations (65) and (67) can be expressed as separate updates per channel tap, namely, $$\hat{x}_{2\times 1}(k-i,k;j) = \hat{x}_{2\times 1}(k-i,k-1;j) + P_{2\times 2}(j)e_{2\times 1}(k,i+1;j) \quad (68)$$

and $$e_{2\times 1}(k, 1; j) = P_{2\times 2}^{-1}(j)F_{2\times 2}^{-1}L_{2\times 1}(j)s(k-j)e(k, k-1) \quad (69)$$

where e(k,i+1) (i=0 through N) has the form $$e(k, i+1; j) = \begin{bmatrix} e_{2\times 1}(k, i+1; 1) \\ e_{2\times 1}(k, i+1; 2) \\ \vdots \end{bmatrix}. \quad (70)$$

Unfortunately, equation (66) does not decouple nicely; it has the form $$e(k, i+1) = \begin{bmatrix} F_{2\times 2} - \sigma_s^2 L_{2\times 1}(1)H_{2\times 1}^T & -s(k-1)s*(k)L_{2\times 1}(2)H_{2\times 1}^T & \cdots \\ -s(k-1)s*(k)L_{2\times 1}(1)H_{2\times 1}^T & F_{2\times 2} - \sigma_s^2 L_{2\times 1}(2)H_{2\times 1}^T & \cdots \\ \vdots & \vdots & \ddots \end{bmatrix}^N e(k, 1). \quad (71)$$

Similar to the LMS tracker, the error signal updates can be approximated by simply taking expected values. Assuming the symbols are uncorrelated, the e(k,i+1;j) update has a block diagonal form so that the term for the jth channel tap is updated using the error signal:

$$e_{2\times 1}(k,i+1;j) \approx (F_{2\times 2} - \sigma_s^2 L_{2\times 1}(j)H_{2\times 1}^T)^H e_{2\times 1}(k,i;j). \quad (72)$$

In summary, the KLMS fixed-lag channel tracker requires evaluating, for each channel tap j, the following state equation for i=1 through N:

$$\hat{x}_{2\times 2}(k-i,k;j) = \hat{x}_{2\times 2}(k-i,k-1;j) + L_{2\times 1}(j,i)s(k-j)e(k,k-1) \quad (73)$$

where $$L_{2\times 1}(j, i) = \left((F_{2\times 2} - \sigma_s^2 L_{2\times 1}(j)H_{2\times 1}^T)^H\right)^{i-1} P_{2\times 2}^{-1}(j)F_{2\times 2}^{-1}L_{2\times 1}(j). \quad (74)$$

Thus, the additional state updates have the same form as the KLMS tracker, except that the step sizes are different and there is coupling between states. This requires tracking $\hat{x}_{2\times 2}(k,k;j)$ which can be obtained from $\hat{x}_{2\times 2}(k+1,k;j)$ using the formula:

$$\hat{x}(k,k) = F^{-1}(k)\hat{x}(k+1,k). \quad (75)$$

Since 1-step predicted values are not necessary, the state value $\hat{x}_{2\times 2}(k,k;j)$ may be tracked directly and used to form the fixed-lag estimates. Multiplication by $F_{2\times 2}$ is required when forming the error signal e(k,k−1).

For example, consider the Integrated Random Walk (IRW) KLMS tracker. For this signal model, the first state is the channel coefficient and the second state is the channel coefficient derivative. As a result, $$F_{2\times 2} = \begin{bmatrix} 1 & 1 \\ 0 & 1 \end{bmatrix}, \quad (76)$$

$$G_{2\times 2} = [0 \ 1]^T \text{ and} \quad (77)$$

$$L_{2\times 1}(j) = \frac{1}{\sigma_s^2(1 + p_{11}(j))} \begin{bmatrix} p_{11}(j) + p_{12}(j) \\ p_{12}(j) \end{bmatrix}, \quad (78)$$

where the values for $p_{ij}$ are parametized.

The inventive processor can also be used with spread spectrum CDMA systems. The estimated parameters could be RAKE receiver combined weights and/or delays. For adaptive correlation to cancel interference, these parameters could be adaptive despreading weights. For multi-user detection, the parameters could include signal strength order as well as channel taps for multiple signals. Indeed, the invention in general terms encompasses all techniques that estimate any value such as AFC (Automatic Frequency Correction), AGC (Automatic Gain Control), phase, etc., using hypotheses of future symbols.

Figure 10:
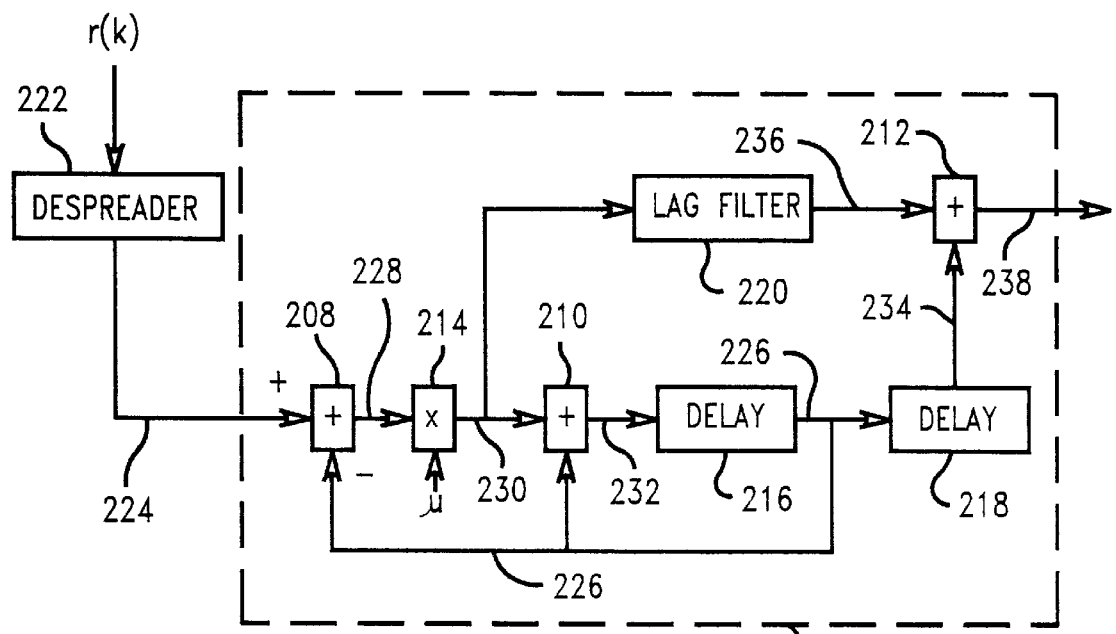
FIG. 10 is a block diagram of an alternative embodiment of the fixed-lag channel estimator shown in FIG. 4 for use in a CDMA system with a pilot channel.

FIG. 10 illustrates an alternative embodiment of the fixed-lag channel estimator 90 for use in CDMA with a pilot channel, e.g., a direct-sequence spread-spectrum pilot channel. The estimator 90 includes adders 208, 210 and 212, a multiplier 214, delay units 216 and 218 and a lag filter 220.

In such a system, it is common to track each channel coefficient separately. Also, since a pilot channel is utilized, symbol hypotheses are not needed; they are known from the pilot channel. The fixed-lag channel estimator 90 shown in FIG. 10 operates as follows.

The received data samples r(k), including the pilot channel, are conventionally despread by a despreader 222 producing a pilot correlation signal 224. The difference between pilot correlation signal 224 and a channel estimate 226 given by ĉ(k,k−1) is determined in the adder 208 to produce an error signal 228 given by e(k,k−1). The error signal 228 is multiplied by a coefficient g in the multiplier 214 producing a modified error signal 230. The modified error signal 230 is added to the channel estimate 226 in the adder 210 producing an updated channel estimate 232 given by ĉ(k+1,k). The updated channel estimate 232 is delayed one update period by the delay unit 216 to produce the channel estimate 226. The channel estimate 226 is delayed an additional update period by the delay unit 218 producing a delayed channel estimate 234 given by ĉ(k−1,k−2). The modified error signal 230 is also input to the lag filter 220.

The lag filter 220 includes delay elements and multipliers and produces a filtered error signal 236. The filtered error signal 236 and the delayed channel estimate 234 are added in the adder 212 to produce a lag-2 channel estimate 238 which is output as the fixed-lag channel estimate 95 (see FIGS. 4 and 7). Thus, based on equation (42) for LMS lag-N tracking, the lag-2 channel estimate 238 is given by the formula:

$$\hat{c}(k-2,k)=\hat{c}(k-2,k-2)+(1-\sigma_s^2\mu)^2\mu e(k,k-1)+(1-\sigma_s^2\mu)\mu e(k-1,k-2). \quad (79)$$

When there is one channel tap, oftentimes only the phase of this tap is tracked using a first order Phase Locked Loop (PLL). A second order Phase Locked Loop can be used to track phase and frequency error, if desired. It is also possible to track channel coefficients, phase and frequency error in the parameter set.

A second order PLL can be viewed as an approximation to a Kalman filter for phase and frequency tracking, in that the phase and its derivative are tracked with constant step sizes. Thus, the IRW KLMS fixed-lag tracker provides the basis for the fixed-lag PLL.

Specifically, the second order PLL equations for tracking phase and frequency can be expressed as:

$$\theta(k+1,k)=\theta(k,k-1)+f(k,k-1)+\beta_1 e(k,k-1) \quad (80)$$

$$f(k+1,k)=f(k,k-1)+\beta_2 e(k,k-1). \quad (81)$$

The second order PLL thus has the form of the IRW KLMS tracker, with $\beta_1=\mu_j$, $\beta_2=\alpha_j$, $s(k-j)=1$, and a fixed P matrix. Applying Kalman filter theory to the above equations, the 0-step prediction values are given by:

$$\theta(k,k)=\theta(k+1,k)-f(k+1,k) \quad (82)$$

$$f(k,k)=f(k+1,k). \quad (83)$$

For fixed-lag estimation of phase and frequency using a second order PLL, the following equations are evaluated for i=1 through N:

$$\theta(k-i,k)=\theta(k-i,k-1)+f(k-i,k-1)+\beta_1(i)e(k,k-1) \quad (84)$$

$$f(k-i,k)=f(k-i,k-1)+\beta_2(i)e(k,k-1), \quad (85)$$

where $\beta_1(i)$ and $\beta_2(i)$ are the parameters, which could be parameterized as functions of the fixed P matrix elements.

This type of phase and frequency tracker could be run until steady state is reached, and then the steady state P matrix can be used to determined the step sizes in terms of the measurement noise power and the plant noise power to both the phase and frequency (phase jitter and phase ramp noise powers).

The present invention can be extended to hypothesize past symbols for channel tracking, even when such extension is unnecessary to cope with the time dispersion of the channel. For example, in the one-tap example above, more channel models can be kept "alive" by keeping hypotheses of past symbols open, rather than using hard decision feedback for tracking. Using past symbol hypotheses alone is disclosed in U.S. Pat. No. 5,557,645 to Dent, the disclosure of which is hereby incorporated by reference herein. In the present invention, past, current, and possibly future symbols would be hypothesized, and there would be a channel estimate associated with each. A metric would be accumulated and used to prune hypotheses.

The present invention can also be used with coarsely detected values rather than hypothesized values. For example, future symbols could be detected with a differential detector for DQPSK (Differential Quadrature Phase Shift Keying), even though there is some ISI requiring an equalizer. These coarse values could be used for channel estimation only, as the symbols would eventually be detected by the equalizer. Also, if periodic pilot symbols were present, then the number of hypotheses would be reduced, as only one value would need to be considered for pilot symbols, as discussed for example in U.S. patent application Ser. No. 09/247,609, entitled "Maximum Likelihood Rake Receiver for use in a Code Division, Multiple Access Wireless Communication System" to P. Dent, the disclosure of which is hereby incorporated by reference herein. If semi-blind, multi-user channel estimation were being used, the known symbols of one of the users could be used to reduce the number of hypotheses.

The use of look-ahead channel tracking according to exemplary embodiments can also be made adaptively. For example, at slow vehicle speeds (i.e., resulting in low Doppler spread), the benefit of looking ahead further may be greater than at high vehicle speeds. Other criteria for changing L are possible, such as metric growth, SNR (Signal to Noise Ratio), and bit error rate. This could be used to save power by controlling the degree of look-ahead on an as needed basis.

For example, one could vary L depending on whether the signal is strong or in a deep fade. When the signal fades, L could be increased until the signal is out of the fade. A fade could be detected by examining the magnitude squared of the channel coefficients, or by examining signal strength, or by some measure of SNR.

Another variation encompassed by the invention comprises receiving signal samples into memory and retrospectively processing them in time-reversal order, such as described in U.S. Pat. Nos. 5,335,250 and 5,841,816 to Dent et al., the disclosures of which are hereby incorporated by reference herein. Thus, whenever in the foregoing description, or claims, a time order of signals is implied by terms such as "prior" and "subsequent," "preceding" and "following," "later" and "earlier," then it should be understood that the technique may also be applied with the time ordering of received signal samples reversed.

While the invention has been described with particular reference to the drawings, it should be understood that various modifications could be made without departing from the spirit and scope of the present invention.

What is claimed is:

1. A method of detecting received symbol values in a communications system comprising the steps of:
   receiving data samples related to a sequence of symbol values;
   developing sets of future hypothetical symbol values;
   developing sets of parameter estimates, one set each for the sets of future hypothetical symbol values, based on the received data samples and the sets of future hypothetical symbol values;
   developing a plurality of metrics, one each for the sets of parameter estimates, based on the sets of parameter estimates and the received data samples; and
   developing detected symbol values based on the plurality of metrics, the detected symbol values related to the received data samples.

2. The method of claim 1, wherein the detected symbol values are related to the future hypothetical symbol values and parameter estimates associated with a metric having the lowest value from the plurality of metrics.

3. The method of claim 1, wherein the parameter estimates are selected from a group including channel coefficients, phase and frequency error, and signal strength or amplitude.

4. The method of claim 1, wherein the parameter estimates are selected from a group including RAKE receiver combining weights, RAKE receiver tap delays, adaptive despreading weights and signal strength.

5. The method of claim 1, wherein the plurality of metrics are developed by combining the sets of parameter estimates with the received data samples, including received data samples that do not depend on certain ones of the future hypothetical symbol values.

6. The method of claim 1, wherein the parameter estimates are developed using an algorithm selected from a group including a Kalman tracking algorithm, a KLMS (Kalman Least Mean Square) tracking algorithm, an LMS (Least Mean Square) tracking algorithm and an RLS (Recursive Least Square) tracking algorithm.

7. The method of claim 1, wherein the plurality of metrics comprise squared error metrics associated with the parameter estimates.

8. The method of claim 7, wherein the squared error metrics are developed by accumulating branch metrics such as given by the formula:

$$|\hat{c}(k)-\hat{s}^*(k)r(k)|^2,$$

where $\hat{c}$ is the parameter estimate, $\hat{s}^*$ is a complex conjugate of the hypothesized symbol value and r is the received data sample, all at time (k).

9. A method of detecting received symbol values in a communications system comprising the steps of:
receiving data samples related to a sequence of symbol values;
hypothesizing combinations of symbol values;
developing, subsequent to said hypothesizing step, parameter estimates associated with each combination of hypothesized symbol values based on the received data samples and the hypothesized symbol values;
developing, subsequent to the step of developing parameter estimates, metrics associated with each parameter estimate based on the received data samples, the hypothesized symbol values and the parameter estimates; and
developing, subsequent to the step of developing metrics, detected symbol values based on the metrics, the detected symbol values related to the received data samples.

10. The method of claim 9, wherein the hypothesized symbol values comprise current and past hypothesized symbol values.

11. The method of claim 9, wherein the hypothesized symbol values used to develop the parameter estimates comprise past, current and future hypothesized symbol values, and wherein the hypothesized symbol values used to develop the metrics comprise past and current hypothesized symbol values.

12. The method of claim 9, wherein the combinations of symbol values are hypothesized over a number of symbol intervals based upon select criteria.

13. The method of claim 12, wherein the select criteria are selected from a group including vehicle speed, Doppler spread, metric growth, signal-to-noise ratio, bit-error-rate and strength of the received data samples.

14. The method of claim 9, wherein the detected symbol values are related to the hypothesized symbol values and parameter estimates associated with a metric having the lowest value.

15. The method of claim 9, wherein the parameter estimates are selected from the group consisting of channel coefficients, phase error and frequency error.

16. The method of claim 9, wherein the parameter estimates are selected from the group consisting of RAKE receiver combined weights, RAKE receiver combined delays, adaptive despreading weights and signal strength.

17. The method of claim 9, wherein the parameter estimates are developed using an algorithm selected from a group including a Kalman tracking algorithm, a KLMS tracking algorithm, an LMS tracking algorithm and an RLS tracking algorithm.

18. The method of claim 9, wherein the metrics comprise squared error metrics associated with the parameter estimates.

19. The method of claim 18, wherein the squared error metrics are developed by accumulating branch metrics such as given by the formula:

$$|\hat{c}(k)-\hat{s}^*(k)r(k)|^2,$$

where $\hat{c}$ is the parameter estimate, $\hat{s}^*$ is a complex conjugate of the hypothesized symbol value and r is the received data sample, all at time (k).

20. A method of detecting received symbol values in a communications system comprising the steps of:
receiving data samples related to sequences of symbol values;
developing first sets of hypothetical symbol values for a first set of symbol periods;
developing second sets of hypothetical symbol values for a second set of symbol periods, wherein the second set of symbol periods includes at least one symbol period later in time than the symbol periods in the first set of symbol periods;
developing parameter estimates based on the received data samples and the second sets of hypothetical symbol values;
developing metrics, more than one each for the first sets of hypothetical symbol values, based on the received data samples, the parameter estimates and the first sets of hypothetical symbol values; and
developing detected symbol values based on the metrics, the detected symbol values related to the received data samples.

21. The method of claim 20, wherein the detected symbol values are related to the first sets of hypothetical symbol values and parameter estimates associated with a metric having the lowest value.

22. The method of claim 20, wherein the first sets of hypothetical symbol values comprise sets of past and current hypothetical symbol values, and wherein the second sets of hypothetical symbol values comprise sets of past, current and future hypothetical symbol values.

23. The method of claim 20, wherein the step of developing metrics further comprises the step of pruning a set of candidate metrics, and wherein the detected symbol values are developed based on the set of pruned metrics.

24. The method of claim 20, wherein the parameter estimates are selected from a group including channel coefficients, phase error and frequency error.

25. The method of claim 20, wherein the parameter estimates are selected from a group including RAKE receiver combined weights, RAKE receiver combined delays, adaptive despreading weights and signal strength.

26. The method of claim 20, wherein the metrics are developed using a Viterbi algorithm.

27. The method of claim 20, wherein the developed metrics are selected from a group including Euclidean distance metrics, and Ungerboeck metrics.

28. The method of claim 20, wherein the step of developing metrics comprises the steps of:
   calculating branch metrics associated with the parameter estimates and the first sets of hypothetical symbol values; and
   summing the branch metrics for each of the first sets of hypothetical symbol values to form path metrics,
   wherein the detected symbol values are developed using the path metrics.

29. The method of claim 20, wherein the parameter estimates are developed using an algorithm selected from a group including a Kalman tracking algorithm, a KLMS (Kalman Least Mean Square) tracking algorithm, an LMS (Least Mean Square) tracking algorithm and an RLS (Recursive Least Square) tracking algorithm.

30. The method of claim 20, wherein the first and second sets of symbol periods are adaptively determined based on select criteria.

31. The method of claim 30, wherein the select criteria are selected from a group including vehicle speed, Doppler spread, metric growth, signal-to-noise ratio, bit-error-rate and strength of the received data samples.

32. In a receiver for receiving data samples transmitted across a channel, a baseband processor comprising:
   a hypothesize unit developing sets of hypothetical symbol values;
   a parameter estimator developing parameter estimates based on the received data samples and the sets of hypothetical symbol values; and
   a sequence estimator receiving the developed parameter estimates, the sets of hypothetical symbol values and a delayed version of the received data samples and developing a sequence of detected symbol values related to the received data samples.

33. The baseband processor of claim 32, wherein the sequence estimator comprises:
   an update metrics unit receiving the developed parameter estimates, the sets of hypothetical symbol values and the delayed version of the received data samples and developing metrics based thereon, one each for the sets of hypothetical symbol values; and
   an extract symbols unit receiving the developed metrics and developing the sequence of detected symbol values based thereon.

34. The baseband processor of claim 33, wherein the developed sequence of detected symbol values corresponds to the set of hypothetical symbol values having the lowest metric value as determined by the extract symbols unit.

35. The baseband processor of claim 32, wherein the parameter estimates are selected from a group including channel coefficients, phase and frequency error, and signal strength or amplitude.

36. The baseband processor of claim 32, wherein the parameter estimates are selected from a group including RAKE receiver combining weights, RAKE receiver tap delays, adaptive despreading weights and signal strength.

37. The baseband processor of claim 32, wherein the parameter estimator comprises a fixed-lag channel estimator developing channel estimates using an algorithm selected from a group including a Kalman tracking algorithm, a KLMS (Kalman Least Mean Square) tracking algorithm, an LMS (Least Mean Square) tracking algorithm and an RLS (Recursive Least Square) tracking algorithm.

38. The baseband processor of claim 33, wherein the metrics developed by the update metrics unit comprise squared error metrics associated with the parameter estimates.

39. The baseband processor of claim 38, wherein the squared error metrics are developed by accumulating branch metrics such as given by the formula:

$$|\hat{c}(k) - \hat{s}^*(k) r(k)|^2,$$

where $\hat{c}$ is the parameter estimate, $\hat{s}^*$ is a complex conjugate of the hypothesized symbol value and r is the received data sample, all at time (k).

40. The baseband processor of claim 32, wherein the sets of hypothetical symbol values comprise past and current hypothetical symbol values.

41. The baseband processor of claim 32, wherein the hypothesize unit hypothesizes sets of symbol values over a number of symbol intervals based upon select criteria.

42. The baseband processor of claim 41, wherein the select criteria are selected from a group including vehicle speed, Doppler spread, metric growth, signal-to-noise ratio, bit-error-rate and strength of the received data samples.

43. The baseband processor of claim 33, wherein the update metrics unit uses a Viterbi algorithm to develop the metrics.

44. The baseband processor of claim 33, wherein the developed metrics are selected from a group including Euclidean distance metrics, and Ungerboeck metrics.

45. The baseband processor of claim 32, wherein the parameter estimator comprises:
   a channel tracker receiving the received data samples and the sets of hypothetical symbol values and developing a channel estimate and an error signal; and
   a lag tracker receiving the channel estimate, the error signal and the sets of hypothetical symbol values and developing a fixed-lag channel estimate as the parameter estimate.

46. The baseband processor of claim 45, wherein the channel tracker uses one of a Kalman tracking algorithm, a KLMS (Kalman Least Mean Square) tracking algorithm, an LMS (Least Mean Square) tracking algorithm and an RLS (Recursive Least Square) tracking algorithm to develop the channel estimate.

47. The baseband processor of claim 45, wherein the lag tracker comprises:
   a first multiplier unit multiplying the error signal by a first multiplier to develop a modified error signal;
   a first delay unit delaying the channel estimate to develop a delayed channel estimate;
   a first adder adding the modified error signal and the delayed channel estimate to develop a lagged channel estimate;
   a second multiplier unit multiplying the modified error signal by a second multiplier to develop a further modified error signal;
   a second delay unit delaying the lagged channel estimate to develop a delayed lagged channel estimate; and
   a second adder adding the further modified error signal and the delayed lagged channel estimate to develop a further lagged channel estimate as the fixed-lag channel estimate.

48. The baseband processor of claim 45, wherein the lag tracker comprises:
   a multiplier unit multiplying the error signal by a multiplier to develop a modified error signal;
   a delay unit delaying the channel estimate to develop a delayed channel estimate; and
   an adder adding the modified error signal and the delayed channel estimate to develop a lagged channel estimate as the fixed-lag channel estimate.

49. The baseband processor of claim 45, wherein the lag tracker comprises:
a first multiplier unit multiplying the error signal by a first multiplier to develop a modified error signal;
a first delay unit delaying the channel estimate to develop a delayed channel estimate;
a second delay unit delaying the modified error signal to develop a delayed modified error signal;
a second multiplier unit multiplying the modified error signal by a second multiplier to develop a further modified error signal; and
an adder adding the further modified error signal, the delayed modified error signal and the delayed channel estimate to develop a lagged channel estimate as the fixed-lag channel estimate.

50. The baseband processor of claim 32, wherein the received data samples include a pilot channel, and wherein the parameter estimator comprises:
a first adder adding a despread version of the pilot channel and a channel estimate to develop an error signal;
a multiplier unit multiplying the error signal by a multiplier to develop a modified error signal;
a second adder adding the modified error signal and the channel estimate to develop an updated channel estimate;
at least one delay unit delaying the updated channel estimate to develop a delayed updated channel estimate;
a lag filter weighting and combining the modified error signal with previous modified error signals to develop a filtered error signal; and
a third adder adding the filtered error signal and the delayed updated channel estimate to develop a fixed-lag channel estimate as the parameter estimate.

51. The baseband processor of claim 50, wherein the pilot channel includes a direct-sequence spread-spectrum pilot channel.

52. In a receiver for receiving data samples transmitted across a channel, a baseband processor comprising:
a first hypothesize unit developing first sets of hypothetical symbol values;
a second hypothesize unit developing second sets of hypothetical symbol values different from the first sets;
a parameter estimator receiving the received data samples and the first and second sets of hypothetical symbol values and developing parameter estimates based thereon; and
a sequence estimator receiving the developed parameter estimates, the first sets of hypothetical symbol values and a delayed version of the received data samples and developing a sequence of detected symbol values related to the received data samples.

53. The baseband processor of claim 52, wherein the first and second sets of hypothetical symbol values are developed for first and second sets of symbol periods, respectively, and wherein the second set of symbol periods includes at least one symbol period later in time than the symbol periods in the first set of symbol periods.

54. The baseband processor of claim 52, wherein the first sets of hypothetical symbol values comprise past and current hypothetical symbol values, and wherein the second sets of hypothetical symbol values comprise future hypothetical symbol values.

55. The baseband processor of claim 53, wherein the first and second sets of symbol periods are adaptively determined based on select criteria.

56. The baseband processor of claim 55, wherein the select criteria are selected from a group including vehicle speed, Doppler spread, metric growth, signal-to-noise ratio, bit-error-rate and strength of the received data samples.

57. The baseband processor of claim 52, wherein the sequence estimator comprises:
an update metrics unit receiving the developed parameter estimates, the first sets of hypothetical symbol values and the delayed received data samples and developing metrics based thereon, more than one each for the first sets of hypothetical symbol values; and
an extract symbols unit receiving the developed metrics and developing the sequence of detected symbol values based thereon.

58. The baseband processor of claim 57, wherein the developed sequence of detected symbol values corresponds to a set of hypothetical symbol values from the first sets having the lowest metric value as determined by the extract symbols unit.

59. The baseband processor of claim 52, wherein the parameter estimator comprises a fixed-lag channel estimator developing channel estimates using an algorithm selected from a group including a Kalman tracking algorithm, a KLMS (Kalman Least Mean Square) tracking algorithm, an LMS (Least Mean Square) tracking algorithm and an RLS (Recursive Least Square) tracking algorithm.

60. The baseband processor of claim 52, wherein the parameter estimates are selected from a group including channel coefficients, phase error and frequency error.

61. The baseband processor of claim 52, wherein the parameter estimates are selected from a group including RAKE receiver combining weights, RAKE receiver tap delays, adaptive despreading weights and signal strength.

62. The baseband processor of claim 57, wherein the metrics developed by the update metrics unit comprise squared error metrics associated with the parameter estimates.

63. The baseband processor of claim 62, wherein the squared error metrics are developed by accumulating branch metrics such as given by the formula:

$$|\hat{c}(k) - \hat{s}^*(k) r(k)|^2,$$

where $\hat{c}$ is the parameter estimate, $\hat{s}^*$ is a complex conjugate of the hypothesized symbol value and r is the received data sample, all at time (k).

64. The baseband processor of claim 57, wherein the update metrics unit uses a Viterbi algorithm to develop the metrics.

65. The baseband processor of claim 57, wherein the developed metrics are selected from a group including Euclidean distance metrics, and Ungerboeck metrics.

66. The baseband processor of claim 57, wherein the metrics developed by the update metrics unit comprise path metrics developed by calculating branch metrics associated with the parameter estimates and the first sets of hypothetical symbol values, and summing the branch metrics for each of the first sets of hypothetical symbol values to form path metrics, more than one each for the first sets of hypothetical symbol values, the extract symbols unit using the path metrics to develop the sequence of detected symbol values.

67. The baseband processor of claim 52, wherein the parameter estimator comprises:
a channel tracker receiving the received data samples and the first and second sets of hypothetical symbol values and developing a channel estimate and an error signal; and a lag tracker receiving the channel estimate, the error signal and the first and second sets of hypothetical symbol values and developing a fixed-lag channel estimate as the parameter estimate.

68. The baseband processor of claim 67, wherein the channel tracker uses one of a Kalman tracking algorithm, a KLMS (Kalman Least Mean Square) tracking algorithm, an LMS (Least Mean Square) tracking algorithm and an RLS (Recursive Least Square) tracking algorithm to develop the channel estimate.

69. In a receiver for receiving-data samples transmitted across a channel, a fixed-lag channel estimator comprising:

a channel tracker receiving the received data samples and developing, using one of a KCLMS (Kalman Least Mean Square) tracking algorithm, an LMS (Least Mean Square) tracking algorithm and an RLS (Recursive Least Square) tracking algorithm, a channel estimate and an error signal; and a lag tracker receiving the channel estimate and the error signal -and developing a fixed-lag channel estimate.

70. The fixed-lag channel estimator of claim 69, wherein the lag tracker comprises:

a first multiplier unit multiplying the error signal by a first multiplier to develop a modified error signal;

a first delay unit delaying the channel estimate to develop a delayed channel estimate;

a first adder adding the modified error signal and the delayed channel estimate to develop a lagged channel estimate;

a second multiplier unit multiplying the modified error signal by a second multiplier to develop a further modified error signal;

a second delay unit delaying the lagged channel estimate to develop a delayed lagged channel estimate; and a second adder adding the further modified error signal and the delayed lagged channel estimate to develop a further lagged channel estimate as the fixed-lag channel estimate.

71. The fixed-lag channel estimator of claim 69, wherein the lag tracker comprises:

a multiplier unit multiplying the error signal by a multiplier to develop a modified error signal;

a delay unit delaying the channel estimate to develop a delayed channel estimate; and an adder adding the modified error signal and the delayed channel estimate to develop a lagged channel estimate as the fixed-lag channel estimate.

72. The fixed-lag channel estimator of claim 69, wherein the lag tracker comprises:

a first multiplier unit multiplying the error signal by a first multiplier to develop a modified error signal;

a first delay unit delaying the channel estimate to develop a delayed channel estimate;

a second delay unit delaying the modified error signal to develop a delayed modified error signal;

a second multiplier unit multiplying the modified error signal by a second multiplier to develop a further modified error signal; and an adder adding the further modified error signal, the delayed modified error signal and the delayed channel estimate to develop a lagged channel estimate as the fixed-lag channel estimate.

73. In a receiver for receiving data samples transmitted across a channel, said data samples including a pilot channel, a fixed-lag channel estimator comprising:

a first adder adding a despread version of the pilot channel and a channel estimate to develop an error signal;

a multiplier unit multiplying the error signal by a multiplier to develop a modified error signal;

a second adder adding the modified error signal and the channel estimate to develop an updated channel estimate;

at least one delay unit delaying the updated channel estimate to develop a delayed updated channel estimate;

a lag filter weighting and combining the modified error signal with previous modified error signals to develop a filtered error signal; and a third adder adding the filtered error signal and the delayed updated channel estimate to develop a fixed-lag channel estimate.

* * * * *